US008283957B2

(12) United States Patent
Sai

(10) Patent No.: US 8,283,957 B2
(45) Date of Patent: Oct. 9, 2012

(54) PHASE-LOCKED LOOP CIRCUIT AND RADIO RECEIVER

(75) Inventor: Akihide Sai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 13/036,860

(22) Filed: Feb. 28, 2011

(65) Prior Publication Data
US 2012/0062292 A1   Mar. 15, 2012

(30) Foreign Application Priority Data
Sep. 13, 2010   (JP) ................................. 2010-204490

(51) Int. Cl.
   *H03L 7/06*   (2006.01)
(52) U.S. Cl. ....................................... 327/157; 327/148
(58) Field of Classification Search .................. 327/148, 327/157
   See application file for complete search history.

(56) References Cited

U.S. PATENT DOCUMENTS

| | | | |
|---|---|---|---|
| 2003/0214362 A1* | 11/2003 | Gauthier et al. | 331/185 |
| 2007/0064837 A1* | 3/2007 | Meltzer | 375/327 |
| 2009/0237138 A1* | 9/2009 | Shanbhag et al. | 327/231 |
| 2010/0090734 A1* | 4/2010 | Eker | 327/157 |
| 2010/0091927 A1* | 4/2010 | Walker et al. | 375/374 |
| 2010/0195779 A1 | 8/2010 | Sai | |
| 2010/0207693 A1* | 8/2010 | Fagg | 331/10 |
| 2010/0283549 A1* | 11/2010 | Wang | 331/34 |
| 2012/0008727 A1* | 1/2012 | Mohajeri et al. | 375/376 |
| 2012/0062292 A1* | 3/2012 | Sai | 327/157 |
| 2012/0063546 A1* | 3/2012 | Kobayashi | 375/316 |

FOREIGN PATENT DOCUMENTS
JP   2010-183285   8/2010

OTHER PUBLICATIONS

Gao et al.; "A Low Noise Sub-Sampling PLL in Which Divider Noise is Eliminated and PD/CP Noise is Not Multiplied by $N^2$", IEEE, Journal of Solid-State circuits, vol. 44, No. 12, pp. 3253-3263, (2009).
Gao et al.; "A 2.2GHZ 7.6MW Sub-Sampling PLL With −126DBC/HZ In-Band Phase Noise and $0.15PS_{RMS}$ Jitter in 0.18μM CMOS", IEEE, International Solid-State Circuits Conference, pp. 1-24, (2009).

* cited by examiner

*Primary Examiner* — Lincoln Donovan
*Assistant Examiner* — Adam Houston
(74) *Attorney, Agent, or Firm* — Finnegan, Henderson, Farabow, Garrett & Dunner, L.L.P.

(57) ABSTRACT

The voltage-controlled oscillator generates a first signal and a second signal having a phase reverse to that of the first signal, frequencies thereof being controlled depending on control voltages. The sub-sampling phase comparator generates first/second sampled voltages by sampling voltages of the first/second signals in each cycle of the reference signal having cycles. The current generating circuit has first/second charge pumps configured to generate first/second current signal depending on supply voltages, the second current signal having a polarity reverse to that of the first current signal. The selection controller selectively carries out a first supply mode for supplying the first and second sampled voltages to the second and first charge pumps and a second supply mode for supplying the first and second sampled voltages to the first and second charge pumps respectively. The loop filter generates the control voltages supplied to the voltage-controlled oscillator by smoothing the composite current signal.

14 Claims, 15 Drawing Sheets

VCO [0] : 0

VCO [1] : 1

VCO [2] : 2

VCO [3] : -1

(A)

INPUT INTO ΔΣ MODULATOR
(LOWER 2 BITS OF FRACTIONAL PART)

| | |
|---|---|
| 00 (0) | 0, -1, 2, -1 |
| 01 (0.25) | 2, -1, 0, 0 |
| 10 (0.5) | 1, 1, 0, 0 |
| 11 (0.75) | 0, 1, -1, -1 |

PHASE-LOCKED LOOP CIRCUIT AND RADIO RECEIVER

CROSS REFERENCE TO RELATED APPLICATIONS

This application is based upon and claims the benefit of priority from the prior Japanese Patent Application No. 2010-204490, filed on Sep. 13, 2010, the entire contents of which are incorporated herein by reference.

FIELD

The embodiments of the present invention relate to a phase-locked loop (PLL) circuit and a radio receiver.

BACKGROUND

In a sub-sampling PLL which has been attracting attention in recent years, phase comparison is performed by sampling the output signal of a voltage-controlled oscillator (VCO) directly with a reference signal. The sub-sampling PLL has an advantage that an extremely high loop gain can be obtained without a dead zone caused in a normal phase comparator.

However, the phase synchronization in the above sub-sampling PLL can be performed only based on a dividing ratio of an integer, and cannot be performed based on a dividing ratio of a decimal fraction.

BRIEF DESCRIPTION OF THE DRAWINGS

FIG. 14 is a diagram to explain the operation of a ΔΣ modulator.

DETAILED DESCRIPTION

Figure 1:
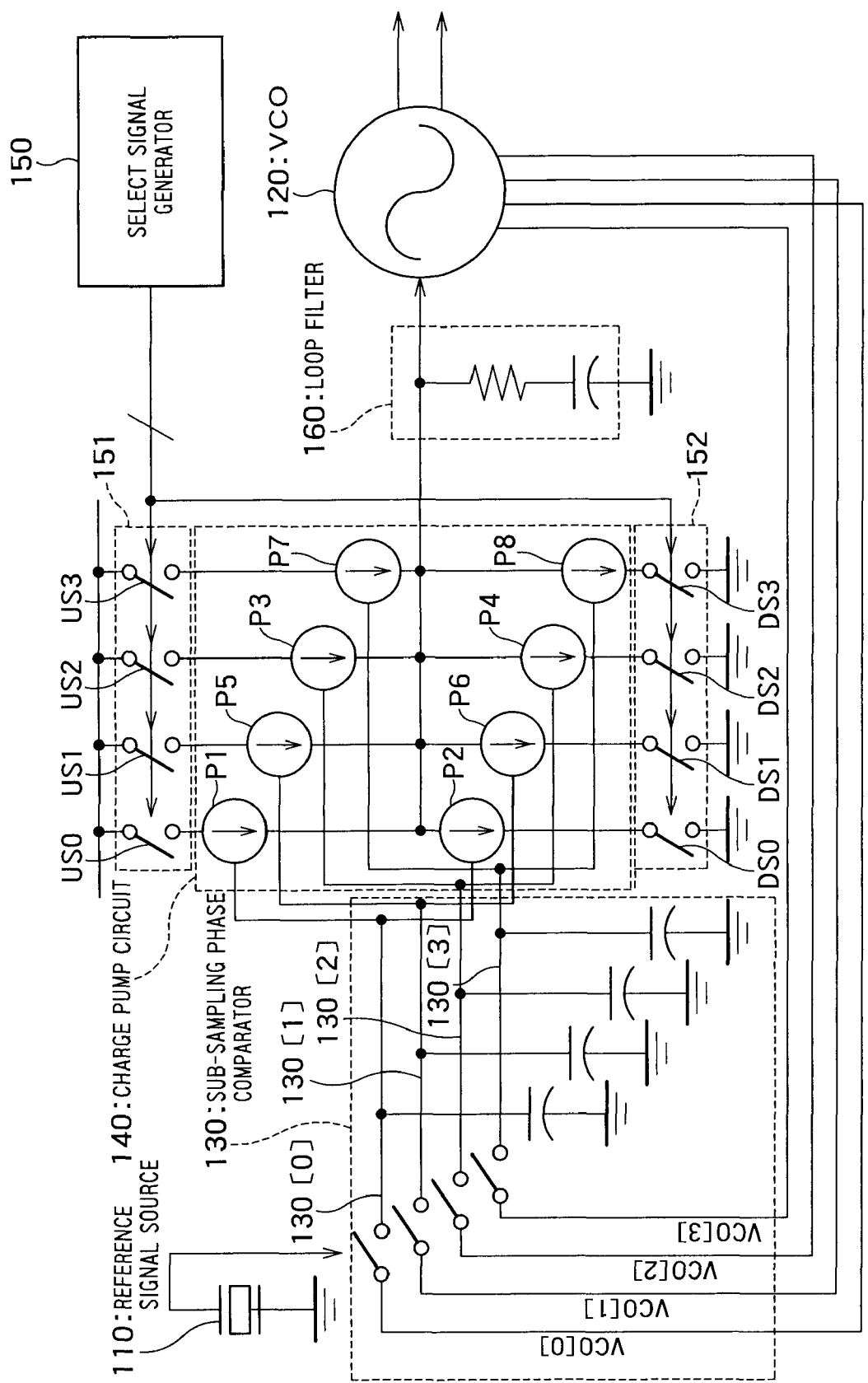
FIG. 1 shows the structure of a phase-locked loop circuit according to a first embodiment.

According to one embodiment of the present invention, there is provided a phase-locked loop circuit including: a reference signal source, a voltage-controlled oscillator, a sub-sampling phase comparator, a current generating circuit, a selection controller, and a loop filter.

The reference signal source generates a reference signal having cycles.

The voltage-controlled oscillator generates a first signal and a second signal having a phase reverse to that of the first signal, frequencies of the first signal and the second signal being controlled depending on control voltages.

The sub-sampling phase comparator generates a first sampled voltage and a second sampled voltage by sampling voltages of the first signal and the second signal in each cycle of the reference signal.

The current generating circuit has a first charge pump configured to generate a first current signal depending on a supply voltage and a second charge pump configured to generate a second current signal having a polarity reverse to that of the first current signal depending on a supply voltage, and generates a composite current signal of the first current signal and the second current signal.

The selection controller selectively carries out a first supply mode for supplying the first and second sampled voltages to the second and first charge pumps respectively and a second supply mode for supplying the first and second sampled voltages to the first and second charge pumps respectively.

The loop filter generates the control voltages supplied to the voltage-controlled oscillator by smoothing the composite current signal.

Hereinafter, embodiments will be explained in detail referring to the drawings.

First Embodiment

FIG. 1 shows the structure of a phase-locked loop circuit according to a first embodiment.

The PLL of FIG. 1 includes: a reference signal source 110; a voltage-controlled oscillator (VCO) 120; a sub-sampling phase comparator 130; a charge pump circuit 140; a select signal generator 150; switching circuits 151 and 152; and a loop filter 160. The select signal generator 150 and the switching circuits 151 and 152 form a selection controller.

The reference signal source 110 generates a reference signal having a predetermined frequency. The reference signal source 110 outputs the generated reference signal to the sub-sampling phase comparator 130.

The voltage-controlled oscillator 120 generates and outputs 2×N multiphase signals each having a frequency controlled depending on the control voltage supplied to the voltage-controlled oscillator 120. The control voltage is supplied by the loop filter 160. N is an arbitrary integer of 1 or greater.

In the present embodiment, N=2, and the voltage-controlled oscillator 120 generates four phase signals. Four phase signals are represented as VCO[0], VCO[1], VCO[2], and VCO[3] respectively.

The phase of the VCO[2] signal is delayed from that of the VCO[0] signal by π. The phase of the VCO[1] signal is delayed from the VCO[0] signal by +π/2. The phase of the VCO[3] signal is delayed from the VCO[2] signal by +π/2. Therefore, VCO[2] is a differential signal of the VCO[0] signal, and VCO[3] is a differential signal of VCO[1].

In brief, when the phase of the VCO[0] signal is defined as 0 (0°), the phase of the VCO[1] signal is π/2(90°), the phase of the VCO[2] signal is π (180°), and the phase of the VCO[3] signal is 3π/2(270°).

Each of the VCO[0] to VCO[3] signals may have a square wave pattern or a sine wave pattern.

VCO[0] corresponds to a first signal, VCO[2] corresponds to a second signal, VCO[1] corresponds to a third signal, and VCO[3] corresponds to a fourth signal.

The VCO 120 may be freely designed as long as it can generate multiphase signals, and thus may be a Q-VCO using an LC tank, for example.

The VCO 120 outputs the generated four phase signals to the sub-sampling phase comparator 130.

The sub-sampling phase comparator 130 includes sampling circuits 130[0], 130[1], 130[2], and 130[3].

Each sampling circuit, which is a simple track hold circuit using only a switch and a capacitor, may be freely designed as long as it can perform sampling.

The sampling circuit 130[0] samples the VCO[0] signal in each cycle of the reference signal in order to acquire a sampled voltage.

Similarly, the sampling circuits 130[1], 130[2], and 130[3] sample the VCO[1], VCO[2], and VCO[3] signals respectively in each cycle of the reference signal in order to acquire sampled voltages corresponding thereto.

Each sampling circuit simultaneously performs the sampling at the rising edge of the reference signal, for example.

The sampled voltage of the VCO[0] signal corresponds to a first sampled voltage, the sampled voltage of the VCO[1] signal corresponds to a third sampled voltage, the sampled voltage of the VCO[2] signal corresponds to a second sampled voltage, and the sampled voltage of the VCO[3] signal corresponds to a fourth sampled voltage.

The sampled voltage of the VCO[0] signal is supplied to an UP charge pump P1 and a DN charge pump P2.

The sampled voltage of the VCO[1] signal is supplied to an UP charge pump P5 and a DN charge pump P6.

The sampled voltage of the VCO[2] signal is supplied to an UP charge pump P3 and a DN charge pump P4.

The sampled voltage of the VCO[3] signal is supplied to an UP charge pump P7 and a DN charge pump P8.

The charge pump circuit 140 includes the UP charge pumps P1, P5, P3, and P7 on the upper side and the DN charge pumps P2, P6, P4, and P8 on the lower side. Each charge pump functions as a current source.

Each of the UP charge pumps P1, P5, P3, and P7 generates a positive current signal with respect to the reference depending on the supply voltage. A greater positive current signal is generated as the supply voltage becomes greater.

Each of the DN charge pumps P2, P6, P4, and P8 generates a negative current signal with respect to the reference depending on the supply voltage. A greater negative current signal is generated as the supply voltage becomes greater.

The charge pumps P1, P2, P3, P4, P5, P6, P7, and P8 generate first, second, third, fourth, fifth, sixth, seventh, and eighth current signals respectively. Naturally, "positive" is a polarity reverse to "negative", and vice versa.

In this example, the charge pump circuit 140 includes four pairs of UP/DN current sources, and each pair may be a differential pair structured by tail current.

The switching circuit 151 includes switches US0, US1, US2, and US3 for switching ON/OFF of the charge pumps P1, P5, P3, and P7 respectively.

The switching circuit 152 includes switches DS0, DS1, DS2, and DS3 for switching ON/OFF of the charge pumps P2, P6, P4, and P8 respectively.

When any one of the switches US0 to US3 is ON, the UP charge pump corresponding thereto is selected. The selected UP charge pump generates a current signal depending on the sampled voltage supplied by the corresponding sampling circuit. When the corresponding switch is OFF, the UP charge pump does not operate even when being supplied with the sampled voltage from the corresponding sampling circuit.

When any one of the switches DS0 to DS3 is ON, the DN charge pump corresponding thereto is selected. The selected DN charge pump generates a current signal depending on the sampled voltage supplied by the corresponding sampling circuit. When the corresponding switch is OFF, the DN charge pump does not operate even when being supplied with the sampled voltage from the corresponding sampling circuit.

The select signal generator 150 controls ON and OFF of the switches US0 to US3 and the switches DS0 to DS3 to select one UP charge pump and one DN charge pump. The selection is performed in each cycle of the reference signal. For example, the selection is performed at the rising edge of the reference signal.

The select signal generator 150 selectively carries out four or two of the following processes in the order depending on a target fractional dividing ratio:

(1) supplying voltage to the pair of the UP charge pump P3 and the DN charge pump P2 (In other words, the sampled voltage of VCO[0] is inputted into the DN charge pump and the sampled voltage of VCO[2] is inputted into the UP charge pump);

(2) supplying voltage to the pair of the UP charge pump P1 and the DN charge pump P4 (In other words, the sampled voltage of VCO[2] is inputted into the DN charge pump and the sampled voltage of VCO[0] is inputted into the UP charge pump);

(3) supplying voltage to the pair of the UP charge pump P7 and the DN charge pump P6 (In other words, the sampled voltage of VCO[1] is inputted into the DN charge pump and the sampled voltage of VCO[3] is inputted into the UP charge pump); and (4) supplying voltage to the pair of the UP charge pump P5 and the DN charge pump P8 (In other words, the sampled voltage of VCO[3] is inputted into the DN charge pump and the sampled voltage of VCO[1] is inputted into the UP charge pump).

Each pair of charge pumps shown in the above processes (1) to (4) are inputted with the sampled voltages of two VCO signals having phases reverse to each other, and thus each pair of charge pumps operate differentially.

Carrying out the process (1) corresponds to carrying out a first supply mode.

Carrying out the process (2) corresponds to carrying out a second supply mode.

Carrying out the process (3) corresponds to carrying out a third supply mode.

Carrying out the process (4) corresponds to carrying out a fourth supply mode.

The order and number of processes to be selected are determined depending on a target fractional dividing ratio.

For example, when the fractional dividing ratio is 0.25, the above processes are repeatedly carried out in the order of (1), (3), (2), (4), namely in the order of (1), (3), (2), (4), (1), (3), (2), (4), (1) . . . . Note that the process (1) is not necessarily required to be carried out first as long as the repetition is based on this rule (the same can be similarly applied to the other cases).

When the fractional dividing ratio is 0.75, the above processes are repeatedly carried out in the order of (2), (3), (1), (4), namely in the order of (2), (3), (1), (4), (2), (3), (1), (4), (2) . . . .

When the fractional dividing ratio is 0.5, two processes are repeatedly carried out in the order of (4), (3), (4), (3), (4) . . . , for example. Alternatively, the order of (1), (2), (2), (3) . . . can be employed (in this case, the VCO signal serving as a lock target is different from that in the former case).

The charge pump circuit 140 combines the current signals generated by the UP charge pump and DN charge pump selected by the select signal generator 150, and outputs the composite current signal to the loop filter 160.

The loop filter 160 smoothes the current signal supplied by the charge pump circuit 140 to generate a control voltage. The loop filter 160 supplies the generated control voltage to the voltage-controlled oscillator 120.

The voltage-controlled oscillator 120 controls oscillation frequency depending on the control voltage supplied by the loop filter 160 to generate and output four multiphase signals (VCO[0] to VCO[3] signals).

Figure 2:
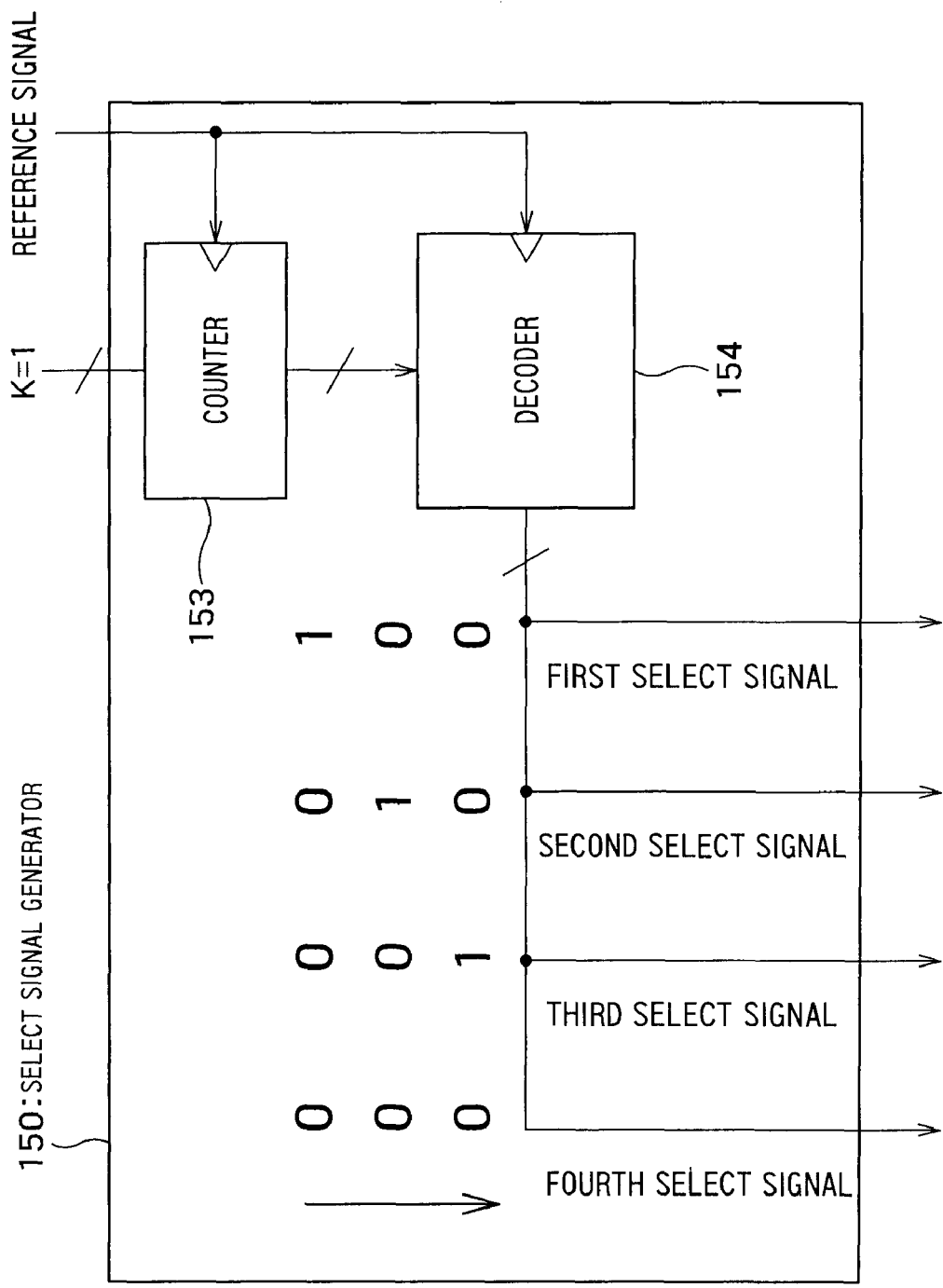
FIG. 2 shows a detailed structure of a select signal generator according to the first embodiment.

FIG. 2 shows a detailed structure of the select signal generator 150.

The select signal generator 150 can realize a plurality of fractional dividing ratios based on a parameter K and N (the number of multiphase signals). K is an integer or a decimal having a value smaller than N.

The fractional dividing ratio is expressed as K/N. When K=1 and N=4, for example, dividing ratio K/N=1/4=0.25. When K=3 and N=4, dividing ratio K/N=3/4=0.75. When K=2 and N=4, dividing ratio K/N=2/4=0.5.

The select signal generator 150 includes a counter 153 and a decoder 154.

The counter 153 is inputted with the value of the parameter K and the reference signal. The value of the parameter K is stored in and read from a storage (not shown). In this example, K=1. The value of N is 4 as stated above.

The counter 153 counts the value of the parameter K in each cycle of the reference signal (at each rising edge in this case), and outputs a count value. Here, the number of bits of the counter is 2 bits, and the count value cyclically changes from 0 to 3. In other words, in order to express K/N=0.25 as binary data, double figures (figure for expressing 0.5 and figure for expressing 0.25) are required.

Cyclically changing the count value from 0 to 3 means adding up the value of the parameter K at each count to output a remainder when the integer part of the total value is divided by N (mod(integer part of the count value/N)). "mod" shows modulo operation.

Since K=1 in this example, the counter value becomes 00, 01, 10, 11, 00, 01, 10, 11, 00, . . . , namely 0, 1, 2, 3, 0, 1, 2, 3 . . . .

When considering this case based on modulo operation, the total counted value of the parameter K becomes 0, 1, 2, 3, 4, 5, 6, 7, 8 . . . (when the first count value is defined as 0.) Therefore, the total counted value becomes 0, 1, 2, 3, 0, 1, 2, and 3 after performing modulo operation.

When K=3, the counter value becomes 00, 11, 10, 01, 00, 11, 10, 01, 00, . . . , namely 0, 3, 2, 1, 0, 3, 2, 1, 0 . . . .

The decoder 154 retains the correspondence between the value outputted from the counter 153 and codes (first to fourth select signals).

The first select signal shows whether the pair of charge pumps in the process (1) should be selected or not.

The second select signal shows whether the pair of charge pumps in the process (3) should be selected or not.

The third select signal shows whether the pair of charge pumps in the process (2) should be selected or not.

The fourth select signal shows whether the pair of charge pumps in the process (4) should be selected or not.

Each of the first to fourth select signals has the value of "1" or "0." "1" shows selection and "0" shows non-selection.

When the output value from the counter is 0, the decoder 154 outputs 1, 0, 0, 0 as the first to fourth select signals. That is, the pair of charge pumps (P3 and P2) in the process (1) are selected.

When the output value from the counter is 1, the decoder 154 outputs 0, 1, 0, 0 as the first to fourth select signals. That is, the pair of charge pumps (P7 and P6) in the process (3) are selected.

When the output value from the counter is 2, the decoder 154 outputs 0, 0, 1, 0 as the first to fourth select signals. That is, the pair of charge pumps (P1 and P4) in the process (2) are selected.

When the output value from the counter is 3, the decoder 154 outputs 0, 0, 0, 1 as the first to fourth select signals. That is, the pair of charge pumps (P5 and P8) in the process (4) are selected.

In the example shown in FIG. 2, the codes (first to fourth select signals) are outputted in the order of "1, 0, 0, 0," "0, 1, 0, 0," "0, 0, 1, 0," . . . .

Each of the first to fourth select signals is distributed as a control signal for the corresponding switch.

Concretely, the first select signal is inputted into the switch DS0 and the switch US2.

The second select signal is inputted into the switch DS1 and the switch US3.

The third select signal is inputted into the switch DS2 and the switch US0.

The fourth select signal is inputted into the switch DS3 and the switch US1.

The switch inputted with the select signal having the value of 1 is turned ON and the switch inputted with the select signal having the value of 0 is turned OFF.

Since the decoder 154 and the counter 153 operate corresponding to each cycle of the reference signal, the switch is turned ON and OFF corresponding to each cycle of the reference signal.

Figure 3:
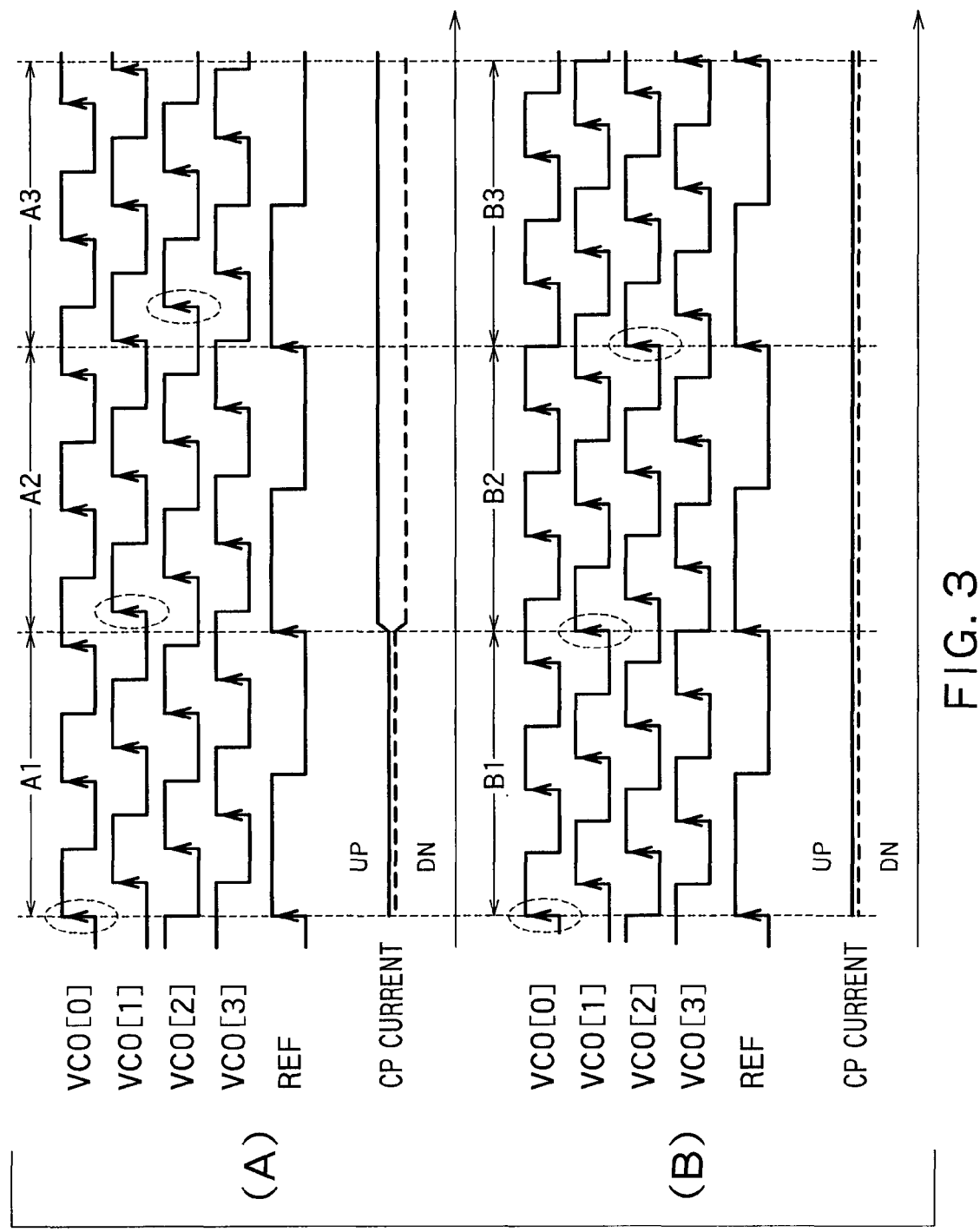
FIG. 3 shows time charts before and after phase synchronization is achieved by a PLL according to the first embodiment.

FIG. 3 shows time charts before and after phase synchronization is achieved by the PLL when K=1.

The rising edge of the signal serving as a lock target is encircled by a broken line.

In FIG. 3 (A), the VCO[0] signal serving as a lock target synchronizes with the reference signal in the cycle interval A1 of the reference signal. That is, the rising edge of the reference signal is consistent with the rising edge of the VCO[0] signal.

At this time, selected are a pair of charge pumps including a DN charge pump inputted with the VCO[0] signal, namely the pair in the process (1). The first to fourth select signals are 1, 0, 0, and 0. The select signal generator 150 sequentially selects a pair including a DN charge pump inputted with the voltage of a VCO signal serving as a lock target.

In the pair of the process (1), the sampled voltage of VCO[0] is inputted into the DN charge pump P2 and the sampled voltage of VCO[2] is inputted into the UP charge pump P3. These voltages are equal to each other.

In FIG. 3, each VCO signal has an ideal rectangular shape, but actually has a trapezoidal shape (the rising edge and the falling edge are slanted). Therefore, the sampled voltages of VCO[0] and VCO[2], when their phases are consistent with each other, are equal to each other at the intermediate voltage between low level and high level (the slant edges are intersected with each other in the middle).

In the cycle interval A1 of FIG. 3, the horizontal lines showing the CP (charge pump) current of the UP and DN charge pumps have the same height, which shows the intermediate voltage.

Since both of the sampled voltages are equal to each other, the current of the charge pump P2 and that of the charge pump P3 counteract each other. Therefore, the composite current value is zero (reference value).

In the cycle interval A2 of the reference signal, VCO[1] serving as a lock target does not synchronize with the reference signal. In the cycle interval A2, the pair in the process (3) are selected. The first to fourth select signals are 0, 1, 0, and 0.

The sampled voltage of VCO[1] is at low level at the rising edge of the reference signal, and the sampled voltage of VCO[3] is at high level at the rising edge of the reference signal.

Therefore, the high-level sampled voltage of VCO[3] is inputted into the UP charge pump P7 to increase the positive current signal, and the low-level sampled voltage of VCO[1] is inputted into the DN charge pump P6 to reduce the negative current signal.

In this way, the composite current signal is increased from zero (reference value). The currents are increased by the same magnitude. When this magnitude is defined as ΔI1, the value of the composite current signal is increased by 2×ΔI1 from zero (reference value).

The composite current signal is inputted into the VCO 120 as the control voltage through the loop filter 160. The oscillation frequency of the VCO 120 is increased.

In the next cycle interval A3, VCO[2] serving as a lock target does not synchronize with the reference signal. In the cycle interval A3, the pair in the process (2) are selected. The first to fourth select signals are 0, 0, 1, and 0.

The sampled voltage of VCO[2] is at low level at the rising edge of the reference signal, and the sampled voltage of VCO[0] is at high level at the rising edge of the reference signal.

Therefore, the high-level sampled voltage of VCO[0] is inputted into the UP charge pump P1 to increase the positive current signal, and the low-level sampled voltage of VCO[2] is inputted into the DN charge pump P4 to reduce the negative current signal.

In this way, the composite current signal is increased from zero (reference value). When this magnitude is defined as ΔI2, the value of the composite current signal is increased by 2×ΔI2 from zero (reference value).

As stated above, since FIG. 3 shows ideal signal forms, 2×ΔI1 increased in the cycle interval A2 and 2×ΔI2 increased in the cycle interval A3 are equal to each other. However, in the actual case where the signal has a trapezoidal shape, the current in the cycle interval A3 is larger, and the current supplied to the loop filter is sequentially increased as the cycle interval proceeds until the current reaches a certain value.

FIG. 3 (B) shows that phase synchronization is achieved after continuing repeating the process shown in FIG. 3 (A).

The rising edges of VCO[0], VCO[1], and VCO[2] are consistent with the reference signal in the cycle intervals B1, B2, B3 . . . respectively, which shows that phase synchronization is achieved. As a result, the fractional dividing ratio of K/N=1/4=0.25 can be realized.

As stated above, according to the present embodiment, it is possible to realize a fractional dividing ratio while keeping the advantage of the sub-sampling PLL that an extremely high loop gain can be obtained without a dead zone caused in a normal phase comparator.

Although the select signal generator is newly added in the present embodiment, the select signal generator simply selects the switch corresponding to the reference signal and thus does not require high power consumption. The present embodiment is effective also in terms of power consumption.

Second Embodiment

In the first embodiment, a plurality of fractional dividing ratios are realized. The present embodiment is specialized in a structure for realizing one fractional dividing ratio of 0.5.

Figure 4:
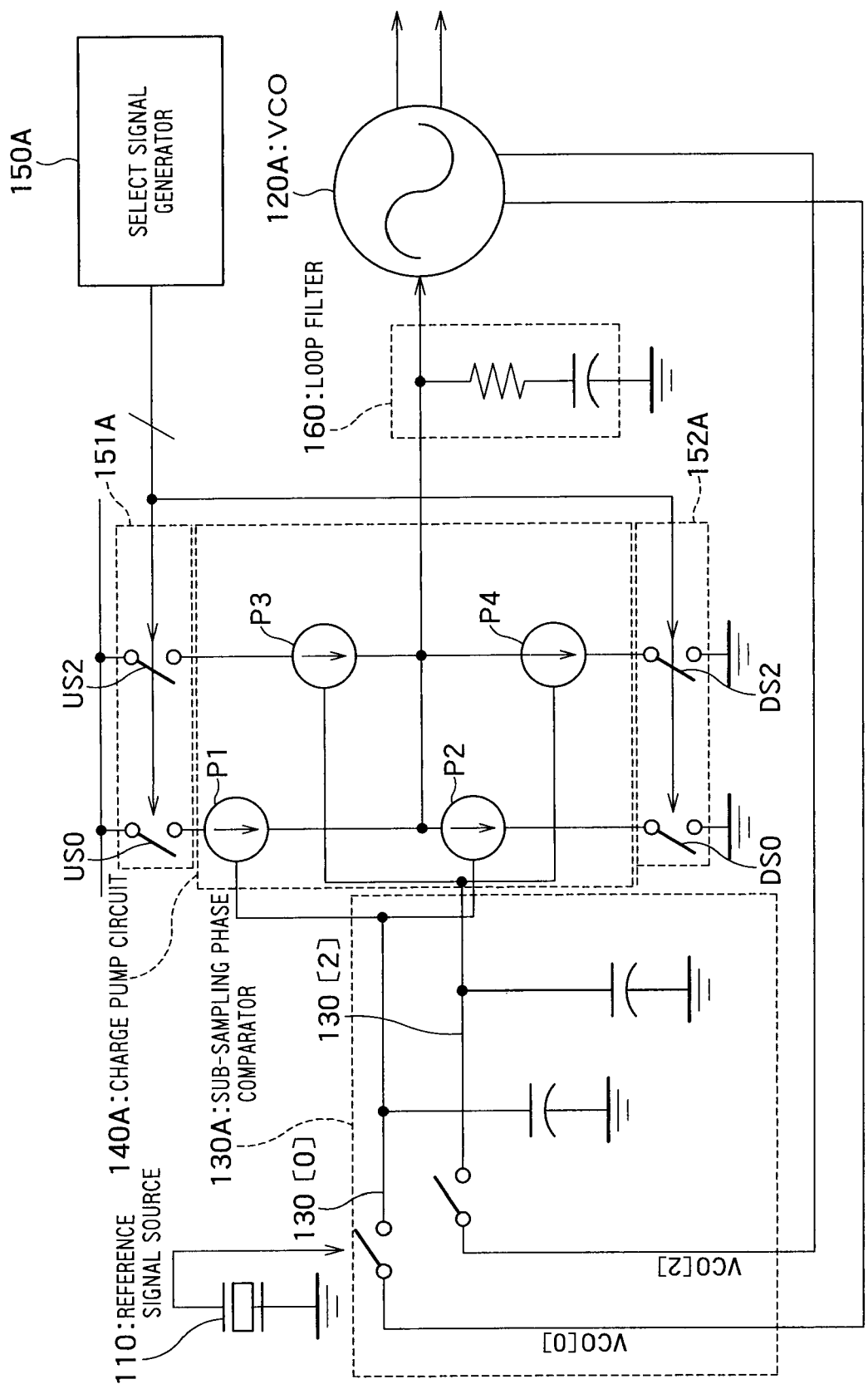
FIG. 4 shows the structure of a PLL according to a second embodiment.

FIG. 4 shows the structure of a PLL according to the second embodiment. The components functioning similarly to those of FIG. 1 are given the same symbols, and the explanation thereof will be omitted.

Differently from the first embodiment, the VCO 120A generates two phase signals of the VCO[0] signal and the VCO[2] signal. When the phase of the VCO[0] signal is defined as 0, the phase of the VCO[2] signal is p.

As will be understood from the comparison with FIG. 1, a sampling phase comparator 130A is formed by removing, from the sampling phase comparator 130 of FIG. 1, the sampling circuits 130[1] and 130[3] corresponding to the VCO[1] signal and the VCO[3] signal respectively.

Similarly, a charge pump circuit 140A is formed by removing, from the charge pump circuit 140 of FIG. 1, the charge pumps P5 and P6 corresponding to the VCO[1] signal and the charge pumps P7 and P8 corresponding to the VCO[3] signal.

Accordingly, a switching circuit 151A is formed by removing the switches US1 and US3 from the switching circuit 151 of FIG. 1, and a switching circuit 152A is formed by removing the switched DS1 and DS3 from the switching circuit 152 of FIG. 1.

The select signal generator 150A alternately selects the following pairs in each cycle of the reference signal:
(1) a pair of the UP charge pump P3 and the DN charge pump P2; and
(2) a pair of the UP charge pump P1 and the DN charge pump P4.

That is, a control signal for turning the switches US2 and DS0 ON while turning the switches US0 and DS2 OFF (first supply mode) and a control signal for turning the switches US2 and DS0 OFF while turning the switches US0 and DS2 ON (second supply mode) are alternately outputted in each cycle of the reference signal.

In this way, the fractional dividing ratio of 0.5 can be realized. This corresponds to the case where K=2 and N=4 in the first embodiment.

As stated above, according to the present embodiment, the fractional dividing ratio of 0.5 can be realized with a structure simpler than that of the first embodiment while keeping the advantage of the sub-sampling PLL.

Third Embodiment

Figure 5:
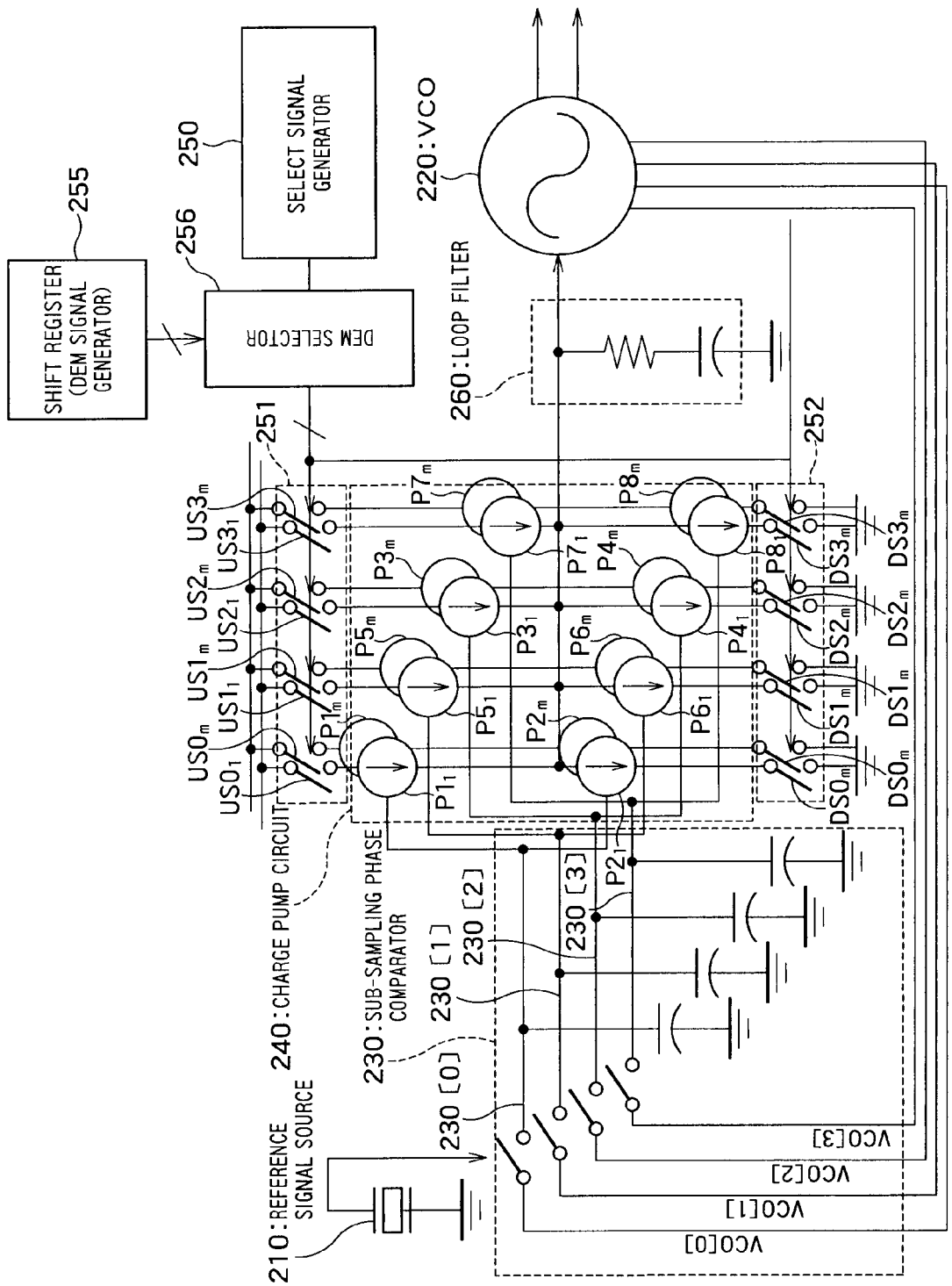
FIG. 5 shows the structure of a PLL according to a third embodiment.

FIG. 5 shows the structure of a PLL according to a third embodiment.

In the PLL of FIG. 5, m (m is an integer of 2 or greater) pumps are arranged as each of the charge pumps P1 to P8. That is, a charge pump circuit 240 includes charge pump groups P1 ($P1_1$ to $P1_m$), P2 ($P2_1$ to $P2_m$), P3 ($P3_1$ to $P3_m$), P4 ($P4_1$ to $P4_m$), P5 ($P5_1$ to $P5_m$), P6 ($P6_1$ to $P6_m$), P7 ($P7_1$ to $P7_m$), and P8 ($P8_1$ to $P8_m$).

Accordingly, m switches are arranged as each of the switches US0 to US3 and DS0 to DS3.

That is, a switching circuit 251 is formed of switch groups US0 ($US0_1$ to $US0_m$), US1 ($US1_1$ to $US1_m$), US2 ($US2_1$ to $US2_m$), and US3 ($US3_1$ to $US3_m$).

A switching circuit 252 is formed of DS0 ($DS0_1$ to $DS0_m$), DS1 ($DS1_1$ to $DS1_m$), DS2 ($DS2_1$ to $DS2_m$), and DS3 ($DS3_1$ to $DS3_m$).

The PPL of FIG. 5 includes a DEM unit formed of a DEM signal generator 255 and a DEM selector 256. DEM represents Dynamic Element Matching.

The PPL of FIG. 5 evenly uses all charge pumps in each of the charge pump groups P1 to P8 in order to reduce spurious outputs of the PLL due to the mismatch among a plurality of charge pumps.

The reference signal source 210, a VCO 220, a sub-sampling phase comparator 230, a loop filter 260 in FIG. 5 function similarly to the reference signal source 110, the VCO 120, the sub-sampling phase comparator 130, the loop filter 160 in FIG. 1, respectively, and thus the explanation thereof will be omitted.

The DEM selector 256 receives, from a select signal generator 250, codes (first to fourth select signals) explained in the first embodiment. Each of the first to fourth select signals has the value of "1" or "0" as stated above, and one of the first to fourth select signals is "1" and each of the other three select signals is "0".

The DEM selector 256 selects one UP charge pump and one DN charge pump from the UP charge pump group and the DN charge pump group corresponding to the select signal having the value of "1."

For example when the first select signal is 1, one charge pump is selected from each of the DN charge pump group P2 and the UP charge pump group P3.

How to select the charge pumps is determined depending on the DEM signal from the DEM signal generator 255.

Figure 6:
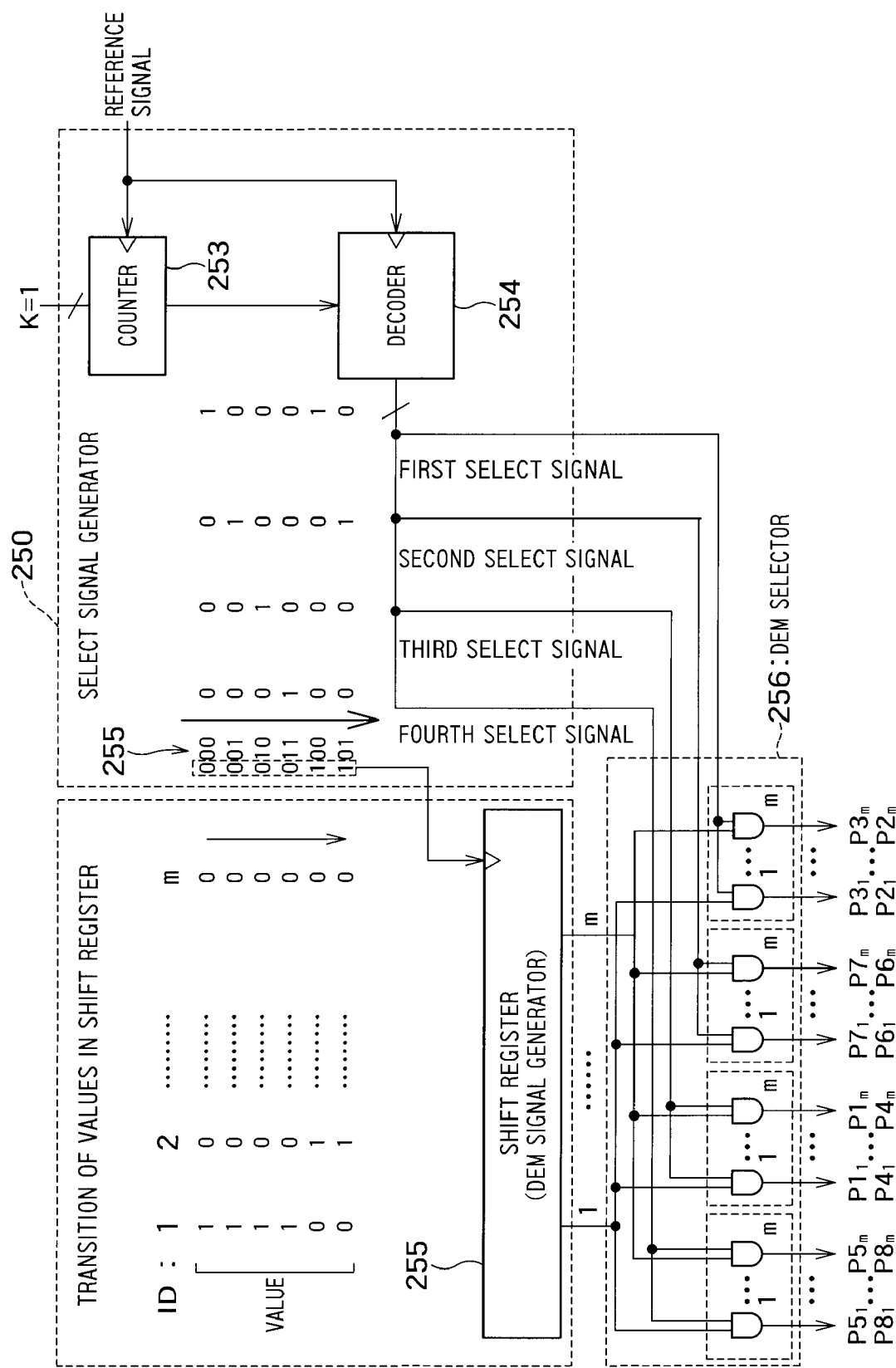
FIG. 6 shows the structures of a DEM signal generator, a DEM selector, and a select signal generator.

FIG. 6 shows the structures of the DEM signal generator 255, the DEM selector 256, and the select signal generator 250.

The select signal generator 250 has a counter 253 and a decoder 254.

The counter 253 performs count similarly to the first embodiment. However, differently from the first embodiment, the number of bits of the counter is increased by one bit on the upper side, and the increased bit (most significant bit) is outputted to the DEM signal generator 255 while the lower bits other than the most significant bit are outputted to the decoder 254 similarly to the first embodiment. This operation is shown by codes 255.

First, the value of the counter 253 is 000, and thus the most significant bit 0 is outputted to the DEM signal generator 255 while two lower bits 00 (namely 0) are outputted to the decoder 254. Next, the value of the counter is 001, and thus 0 is outputted to the DEM signal generator 255 while 01 (namely 1) is outputted to the decoder.

Therefore, the value 0 and 1 are alternately inputted into the DEM signal generator so that the value is changed after being inputted into the DEM signal generator four times as expressed by 0, 0, 0, 0, 1, 1, 1, 1, 0, 0, 0, 0, 1, 1, 1, 1 . . . (namely, corresponding to four cycles of the reference signal). The input into the decoder 254 is performed similarly to the first embodiment.

The DEM signal generator 255 functions as a shift register. The shift register 255 includes m flip-flops. Each flip-flop stores 1 bit. Thus, the shift register 255 stores m bits.

The shift register 255 stores one of m bits as 1 and the others as 0. "ID" in FIG. 6 shows the identifier of each bit. "Value" in FIG. 6 shows the example value of each bit.

When the shift register 255 is inputted with the same value as the previous value by the select signal generator 250, the shift register 255 outputs the bit string (m bits) currently stored therein to the DEM selector 256.

When the shift register 255 is inputted with a value different from the previous value by the select signal generator 250, the bit 1 is shifted by one as shown in the drawing, and the shifted bit string is outputted to the DEM selector 256.

The DEM selector 256 includes m AND gates corresponding to each of a pair (1') of the charge pump groups P3 and P2, a pair (2') of the charge pump groups P1 and P4, a pair (3') of the charge pump groups P7 and P6, and a pair (4') of the charge pump groups P5 and P8.

The first select signal is inputted into each of m AND gates corresponding to the pair (1'). Further, the 1st to m-th bits of the bit string outputted from the shift register 255 are inputted into the 1st to m-th AND gates respectively. The AND gate outputs 1 when the value of the first select signal is 1 and the bit value from the shift register 255 is 1, and outputs 0 in the other cases.

The value outputted from each AND gate is inputted into the switch of the corresponding charge pump. That is, the output of the 1st AND gate is inputted into the switches $US2_1$ and $DS0_1$ corresponding to the 1st charge pumps P31 and P21. The output of the m-th AND gate is inputted into the switches $US2_m$ and $DS0_m$ corresponding to the m-th charge pumps $P3_m$ and $P2_m$. The switch inputted with 0 is turned OFF while the switch inputted with 1 is turned ON.

m AND gates corresponding to the pair (3') operate as in the pair (1') depending on the input of the second select signal and the bit string inputted from the shift register 255.

m AND gates corresponding to the pair (2') operate as in the pair (1') depending on the input of the third select signal and the bit string inputted from the shift register 255.

m AND gates corresponding to the pair (4') operate as in the pair (1') depending on the input of the fourth select signal and the bit string inputted from the shift register 255.

As stated above, the DEM selector 256 cyclically selects m charge pumps in the order of 1 to m in each of the charge pump groups P1 to P8. That is, a different charge pump is selected every time in each of the charge pump groups P1 to P8.

The present embodiment can be applied to the PLL using four charge pumps P1 to P4 as in the second embodiment (FIG. 4).

As stated above, according to the present embodiment, spurious outputs of the PLL due to the mismatch among a plurality of charge pumps can be reduced, in addition to the effect of the first embodiment.

Fourth Embodiment

Figure 7:
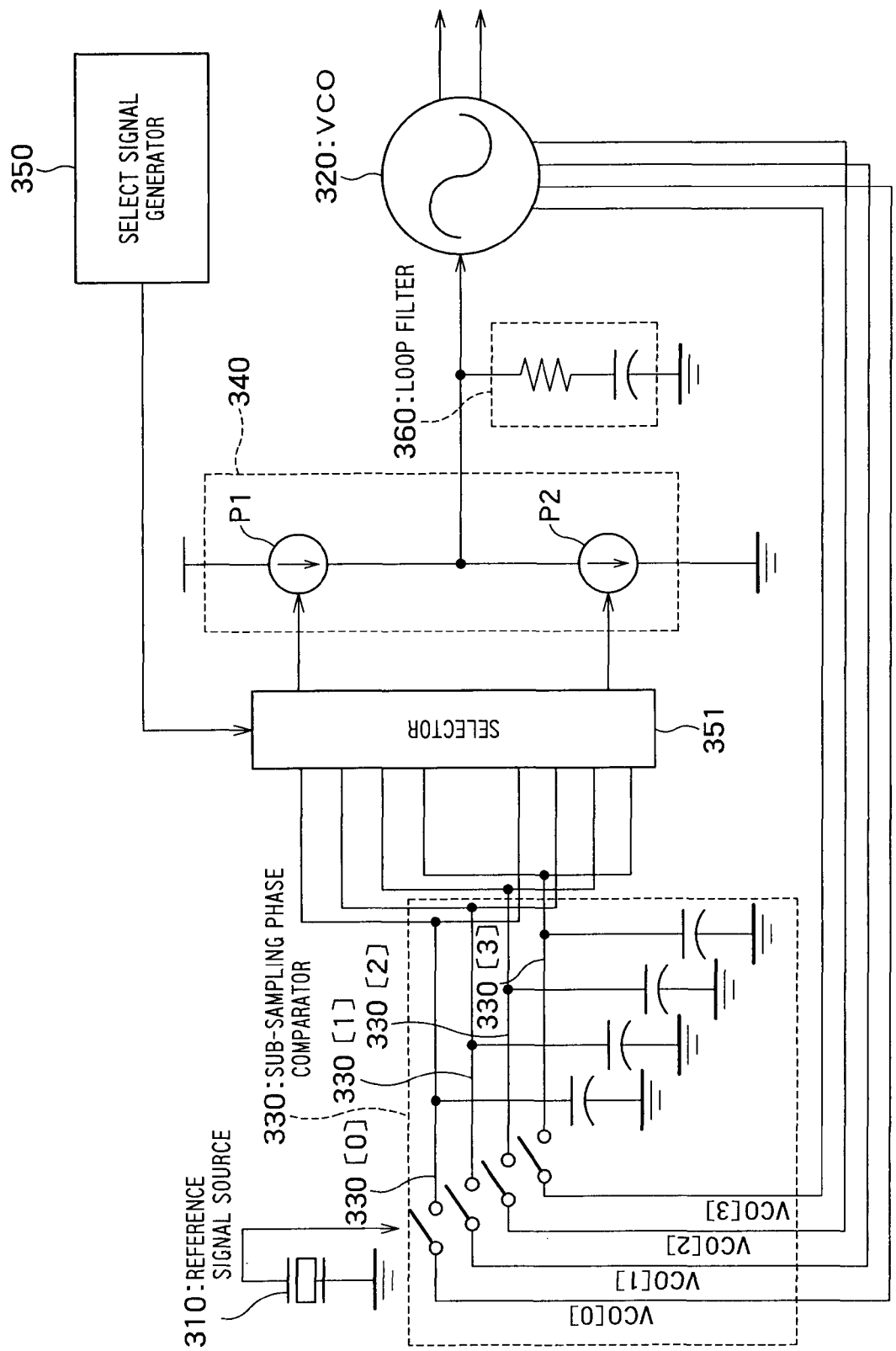
FIG. 7 shows the structure of a PLL according to a fourth embodiment.

FIG. 7 shows the structure of a PLL according to a fourth embodiment.

The PLL of FIG. 7 includes: a reference signal source 310; a VCO 320; a sub-sampling phase comparator 330; a charge pump circuit 340; a select signal generator 350; a selector 351; and a loop filter 360.

The reference signal source 310, the VCO 320, the sub-sampling phase comparator 330, and the loop filter 360 function similarly to the reference signal source 110, the VCO 120, the sub-sampling phase comparator 130, and the loop filter 160 in the first embodiment, respectively.

The charge pump circuit 340 includes the UP charge pump P1 and the DN charge pump P2. The UP charge pump P1 and the DN charge pump P2 function similarly to those shown in FIG. 1 of the first embodiment.

The charge pump circuit 340 combines a current signal (first current signal) generated by the UP charge pump P1 and a current signal (second current signal) generated by the DN charge pump P2, and supplies the combined current signal to the loop filter 360.

The selector 351 is connected between the sub-sampling phase comparator 330 and the charge pump circuit 340.

The selector 351 receives the sampled voltages of the VCO [0] to VCO[3] signals from sub-sampling circuits 330[0], 330[1], 330[2], and 330[3] respectively.

The selector 351 selects two from the sampled voltages of the VCO[0] to VCO[3] signals, and supplies one to the UP charge pump P1 while supplying the other to the DN charge pump P2.

Similarly to the first embodiment, the select signal generator 350 generates the first to fourth select signals in each cycle of the reference signal, based on the value of the parameter K.

In the first embodiment, each of the first to fourth select signals shows a pair of charge pumps to be selected. In the present embodiment, each of the first to fourth select signals shows the sampled voltages, among the sampled voltage of the VCO[0] to VCO[3] signals, to be supplied to the UP charge pump P1 and the DN charge pump P2.

Concretely, when the first select signal is 1 and the second to fourth select signals are 0, the sampled voltage of the VCO[0] signal is supplied to the DN charge pump P2 while the sampled voltage of the VCO[2] signal is supplied to the UP charge pump P1.

When the second select signal is 1 and the first, third, and fourth select signals are 0, the sampled voltage of the VCO[1] signal is supplied to the DN charge pump P2 while the sampled voltage of the VCO[3] signal is supplied to the UP charge pump P1.

When the third select signal is 1 and the first, second, and fourth select signals are 0, the sampled voltage of the VCO[2] signal is supplied to the DN charge pump P2 while the sampled voltage of the VCO[0] signal is supplied to the UP charge pump P1.

When the fourth select signal is 1 and the first to third select signals are 0, the sampled voltage of the VCO[3] signal is supplied to the DN charge pump P2 while the sampled voltage of the VCO[1] signal is supplied to the UP charge pump P1.

The selector 351 controls the internal switches based on the first to fourth select signals from the select signal generator 350 in order to select and supply two VCO signals to the corresponding charge pumps P1 and P2 respectively.

In this way, the charge pump circuit 340 can be formed of only one pair of charge pumps P1 and P2, and mismatch among the charge pumps can be completely prevented.

In the operation example of the select signal generator shown in the first embodiment, the value of K is an integer. In the following operation example of the select signal generator 350, the value of K is a decimal.

Figure 8:
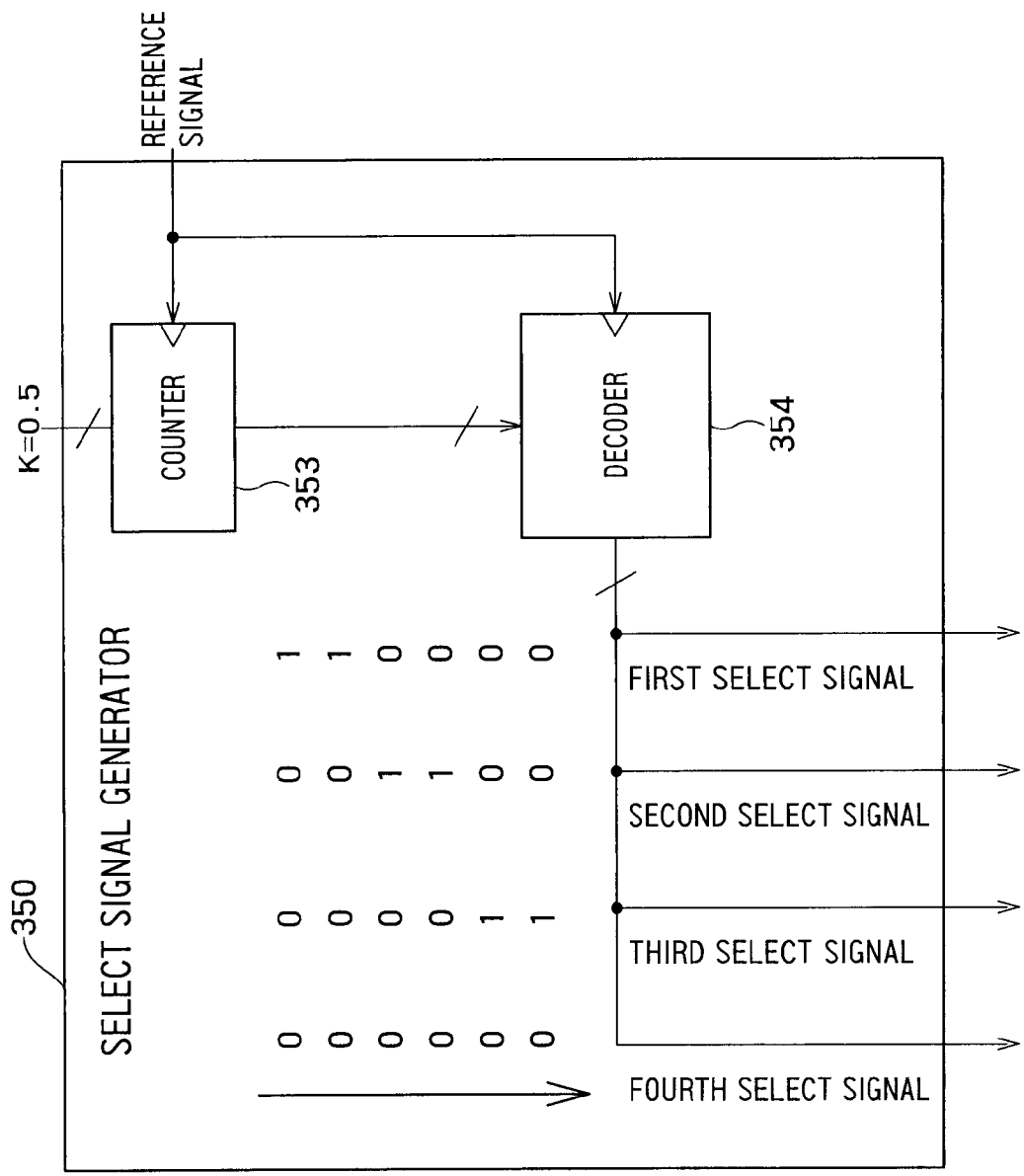
FIG. 8 shows the structure of a select signal generator according to the fourth embodiment.

FIG. 8 shows the structure of the select signal generator 350.

The select signal generator 350 includes a counter 353 and a decoder 354. The counter 353 functions similarly to the counter 153 of FIG. 2, and the decoder 354 functions similarly to the decoder 154 of FIG. 2.

The operation when K=0.5 and N=4 will be shown. The fractional dividing ratio in this case is K/N=0.5/4=0.125. In order to express 0.125 as binary data, 3 bits are required as decimal bits. The counter performs count using 3 bits. The counter outputs upper 2 bits to the decoder 354.

The counter 353 counts K=0.5 in each cycle of the reference signal. The count value becomes 000, 001, 010, 011, 100, 101, 110, 111, 000 . . . . The counter 353 outputs upper double figures of the count value. Accordingly, the output becomes 00, 00, 01, 01, 10, 10, 11, 11, 00 . . . , which can be expressed as 0, 0, 1, 1, 2, 2, 3, 3, 0, . . . in decimal notation.

Similarly to the first embodiment, the decoder 354 generates codes (first to fourth select signals) so that a select signal corresponding to the inputted value is 1 while the other select signals is 0.

In this example, as shown in FIG. 8, the code of the first select signal is 1 while the codes of the second to fourth select signals are 0, and each code is repeated twice.

Next, the code of the second select signal is 1 while the codes of the first, third, and fourth select signals are 0, and each code is repeated twice.

Next, the code of the third select signal is 1 while the codes of the first, second, and fourth select signals are 0, and each code is repeated twice.

Next, the code of the fourth select signal is 1 while the codes of the first, second, and third select signals are 0, and each code is repeated twice.

Successively, the above codes are similarly repeated starting from the code 1 of the first select signal.

The first to fourth select signals generated by the decoder 354 are inputted into the selector 351 to be processed by the selector 351 as stated above.

Figure 9:
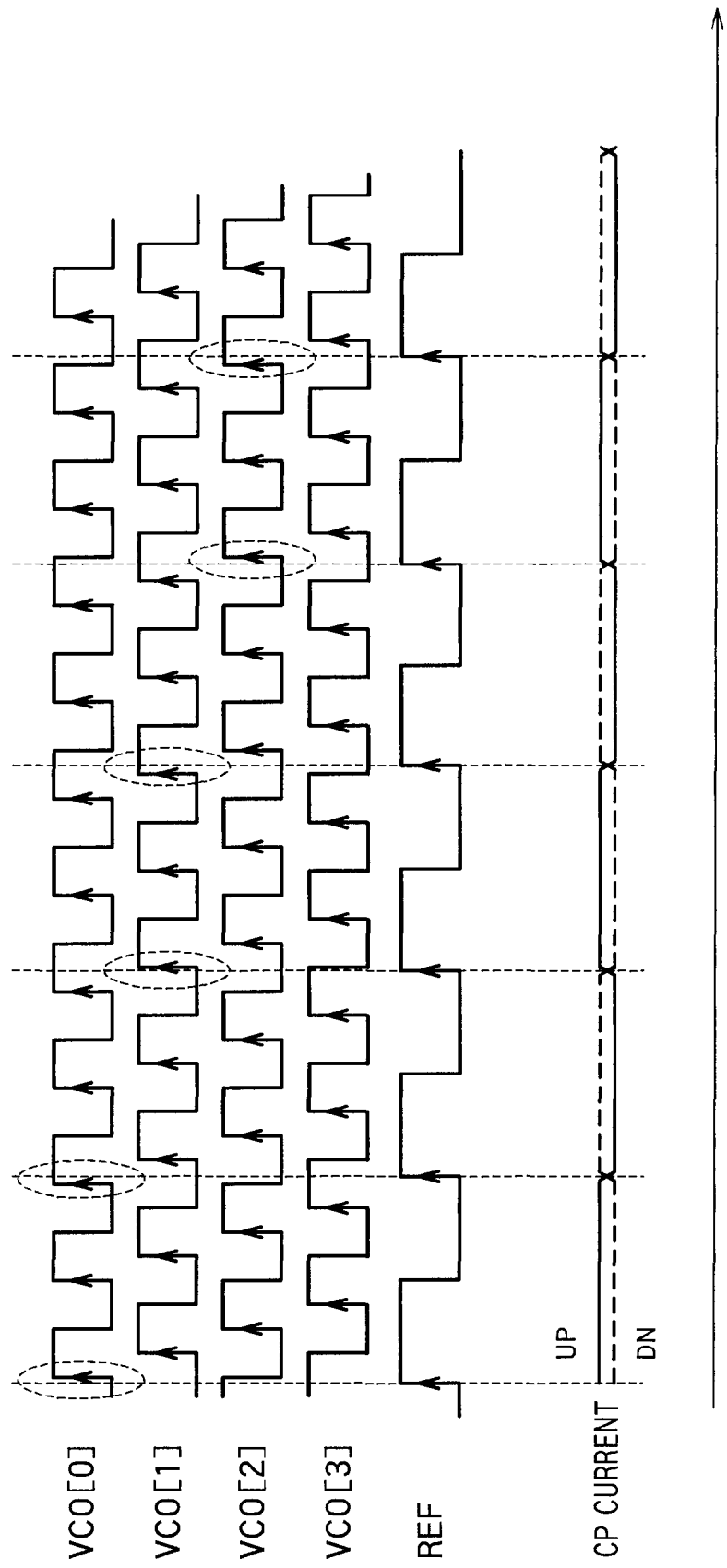
FIG. 9 shows a time chart of a PLL according to the fourth embodiment.

FIG. 9 shows a time chart of the PLL when K=0.5.

Although minor phase differences are caused, phase synchronization is almost achieved with a dividing ratio of 2.125.

For example, in first interval on the leftmost side, the rising edge of the VCO[0] signal almost synchronizes with the rising edge of the reference signal.

In the second interval, the rising edge of VCO[0] almost synchronizes with the rising edge of the reference signal in the middle between the rising edge of VCO[0] and the rising edge of VCO[1].

In the third interval, the rising edge of VCO[1] almost synchronizes with the rising edge of the reference signal.

In the fourth interval, the rising edge of VCO[1] almost synchronizes with the rising edge of the reference signal in the middle between the rising edge of VCO[1] and the rising edge of VCO[2].

The above dividing ration is smaller than the fractional dividing ratio 0.25, which can be realized based on the multiphase number N (=4) of the VCO 320. Thus, as will be understood from FIG. 9, fractional spurious is caused at 1/2 frequency of the reference signal (that is, twice the cycle of the reference signal.) That is, UP current and DN current are periodically repeated with the same pattern at 1/2 frequency of the reference signal.

Fifth Embodiment

Figure 10:
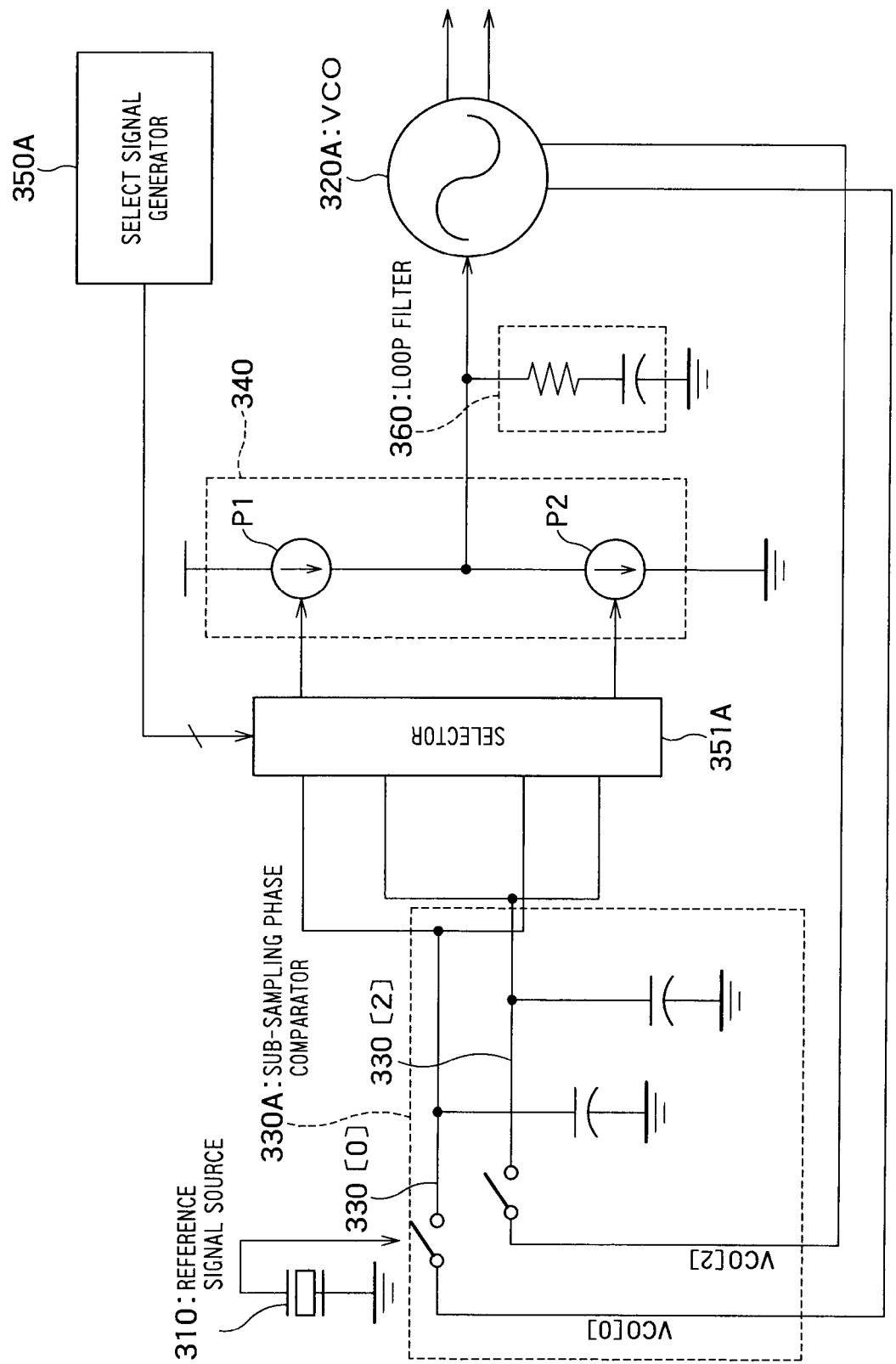
FIG. 10 shows the structure of a PLL according to a fifth embodiment.

In the example shown in the fourth embodiment, the VCO generates four phase signals, but the VCO can be specialized in generating two phase signals (fractional dividing ratio of 0.5) as in the second embodiment. FIG. 10 shows the structure of the PLL in this case.

The loop filter 360, the charge pump circuit 340, and the reference signal source 310 function similarly to the fourth embodiment.

A VCO 320A generates the VCO[0] signal and the VCO[2] signal.

A sub-sampling phase comparator 330A includes sampling circuits 330[0] and 330[2].

The select signal generator 350A alternately outputs the following signals in each cycle of the reference signal: a control signal (select signal) for supplying the sampled voltages of the VCO[0] and VCO[2] signals to the charge pumps P2 and P1 respectively (first supply mode); and a control signal (select signal) for supplying the sampled voltages of the VCO[2] and VCO[0] signals to the charge pumps P2 and P1 respectively (second supply mode).

The selector 351A controls the internal switches depending on the control signal from the select signal generator 350A in order to supply the VCO[0] signal and the VCO[2] signal to the corresponding charge pumps respectively.

As stated above, according to the present embodiment, the charge pump circuit 340 can be formed of only one pair of charge pumps P1 and P2, and mismatch among the charge pumps can be completely prevented.

Sixth Embodiment

Figure 11:
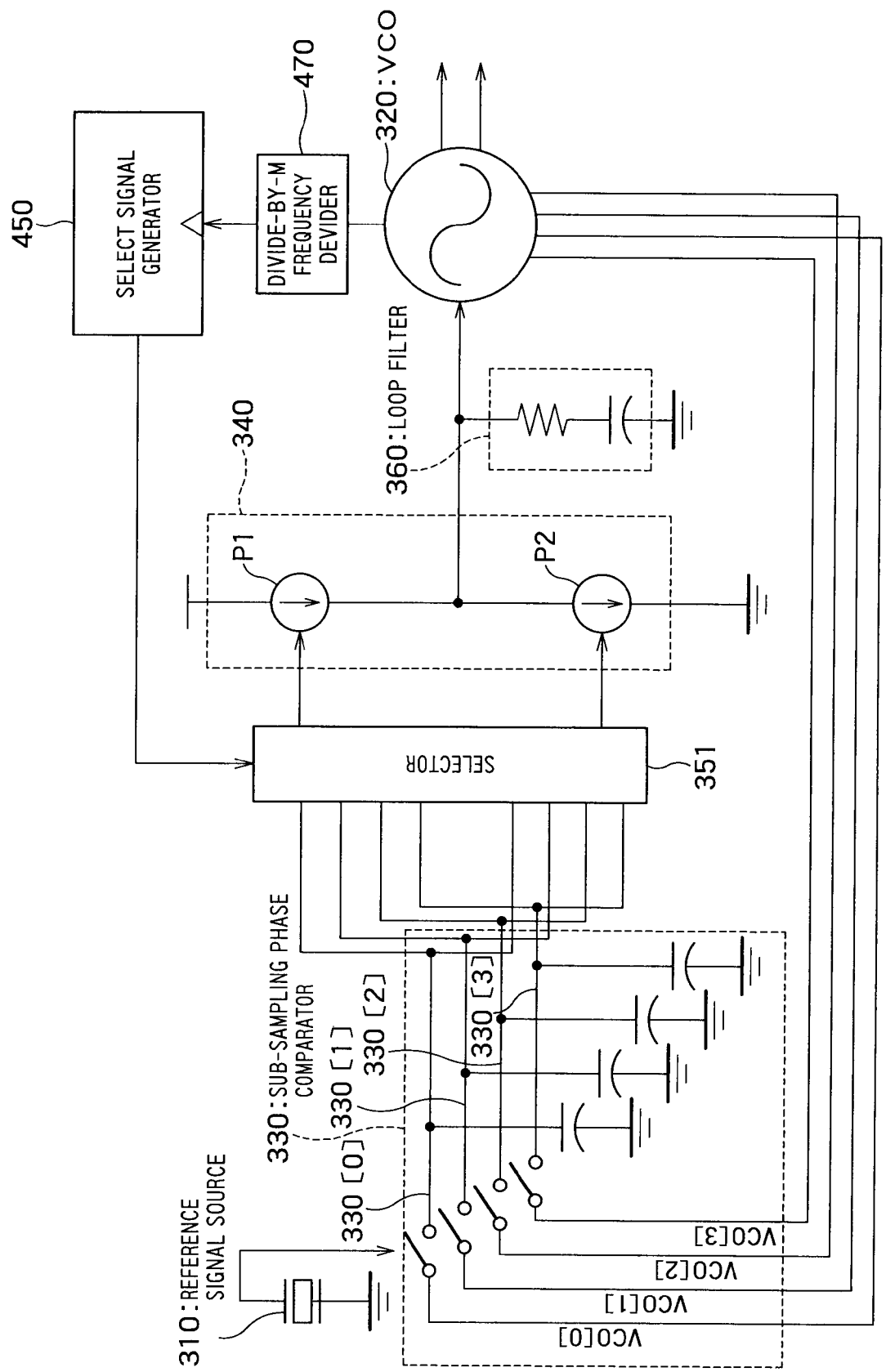
FIG. 11 shows the structure of a PLL according to a sixth embodiment.

FIG. 11 is a diagram showing the structure of a PLL according to a sixth embodiment.

This PLL is formed by adding a divide-by-M frequency divider 470 to the PLL of FIG. 7 in the fourth embodiment while expanding the functions of the select signal generator. The same components as those of FIG. 7 are given the same symbols, and the explanation thereof will be omitted.

In the fourth embodiment, fractional spurious is caused, which is explained using FIG. 9. In the PLL of the present embodiment, a further smaller fractional dividing ratio can be set with minor differences while dissolving or reducing this fractional spurious.

The divide-by-M frequency divider 470 divides the frequency of one of the VCO[0] to VCO[3] signals generated by the VCO 320 by M to generate a signal (divided-by-M signal) having a frequency which is four times or approximately four times greater than that of the reference signal. The divided-by-M signal is used as an operation clock of a select signal generator 450.

The value of M is determined to obtain a frequency which is four times or approximately four times greater than that of the reference signal, based on the information of the frequency which is generated by the VCO to be X times greater than that of the reference signal.

In this specification the integer part of the dividing ratio is 2 for simplification (see FIG. 3, FIG. 9, FIG. 12, etc.), but the integer part is 10s or 100 or greater in most cases of the actual implementation. When the integer part is 10s or 100 or greater, the divide-by-M frequency divider 470 may increase the frequency four or more times greater than that of the reference frequency.

Figure 13:
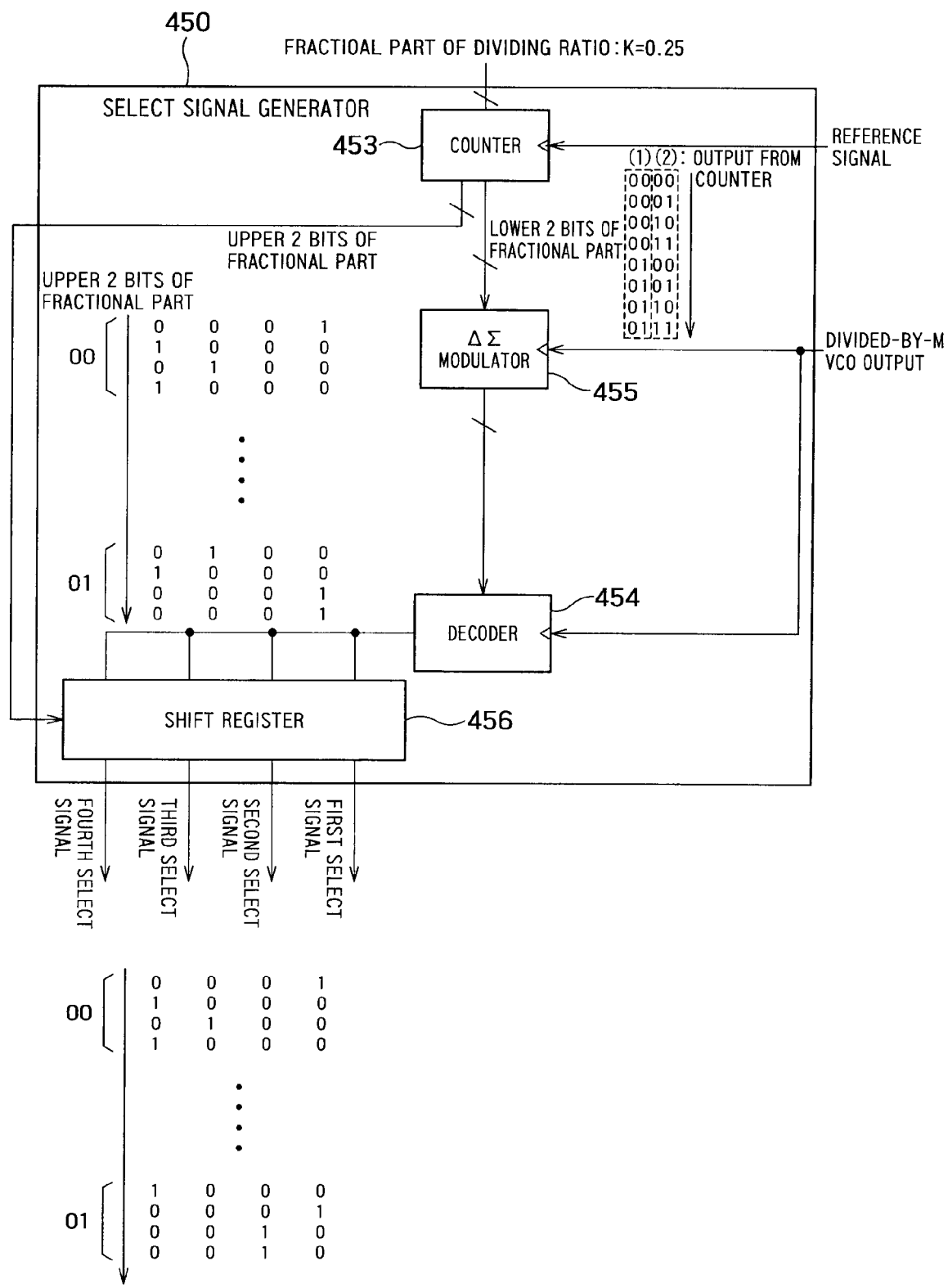
FIG. 13 shows the structure of a select signal generator according to the sixth embodiment.

FIG. 13 shows the structure of the select signal generator 450 of FIG. 11.

The select signal generator 450 includes a counter 453, a $\Delta\Sigma$ modulator 455, a decoder 454, and a shift register 456.

The counter 453 counts the value of the parameter K in each cycle of the reference signal (at each rising edge in this case), and outputs a count value. In this example, K=0.25. Therefore, the fractional part of the dividing ratio is K/N=0.25/4=0.0625. The count value expressed using 4 bits.

That is, the count value becomes 0000(0), 0001(0.0625), 0010(0.125), 0011(0.1875), 0100(0.25), 0101(0.3125), 0110 (0.375), 0111(0.4375), 1000(0.5), 1001(0.5625), 1010(0.625), 1011(0.6875), 1100(0.75), 1101(0.8125), 1110 (0.875), 1111(0.9375), 0000(0) . . . .

In some cases, the upper 2 bits of the 4 bits are called as upper 2 bits of the fractional part, and the lower 2 bits are called as lower 2 bits of the fractional part. That is, in order to express 0.0625 as binary data, 4 bits (for representing each figure(s) of 0.5, 0.25, 0, 125, and 0, 0625) are required to express the fractional part.

In the output (4 bits) from the counter 453, the upper 2 bits are inputted into the shift register 456, and the lower 2 bits are inputted into the $\Delta\Sigma$ modulator 455.

The $\Delta\Sigma$ modulator 455 performs $\Delta\Sigma$ modulation on the inputted lower 2-bit value using a divided-by-M signal (divided-by-M VCO output) as an operation. That is, the $\Delta\Sigma$ modulation is performed totally four times in one cycle interval of the reference signal. The $\Delta\Sigma$ modulator 455 performs over-sampling on the output of the counter with four times greater frequency.

Note that the present embodiment can be appropriately achieved even when the divided-by-M signal does not synchronize with the reference signal. In the present embodiment, the frequency of the divided-by-M signal is exactly four times greater than that of the reference signal and synchronizes with the reference signal, for simplification.

When performing the $\Delta\Sigma$ modulation four times, one of four previously supplied values is randomly selected each time.

The four previously supplied values are 0, 1, 2, and −1 as shown in FIG. 14 (A). The selection is determined depending on an inputted lower 2-bit value.

When the inputted lower 2-bit value is 00(0), the selection is performed so that the total value of the selected values becomes 0. This means that one of the VCO[0] to VCO[3] signals is selected totally four times so that the total phase is consistent with the phase of the VCO[0] signal. This selection corresponds to a first selection process.

Note that when the phase of the VCO[0] signal is defined as 0, the VCO[1] signal is $\pi/2$, the VCO[2] signal is $\pi$, and the VCO[3] signal is $-\pi/2$ ($3\pi/2$).

As will be explained later, each of four selected VCO signals and its corresponding VCO signal having a reversed phase are inputted into the charge pumps P2 and P1 respectively in the cycle of the divided-by-M signal (quarter cycle of the reference signal). That is, the charge pumps are switched (four times) in each cycle of the divided-by-M signal. This is similarly applied to the case where the lower 2-bit value is 01, 10, or 11.

The first selection process means that one supply mode is randomly selected four times from a plurality of supply modes including the first to fourth supply modes so that the total of phases of signals whose sampled voltages are inputted into the charge pump P2 is consistent with the phase of the VCO[0] signal (first signal).

In the other words, one supply mode is randomly selected four times from a plurality of supply modes including the first to fourth supply modes so that the total of phases of signals whose sampled voltages are inputted into the charge pump P1 is consistent with the phase of the VCO[2] signal (second signal).

When the inputted lower 2-bit value is 01(0.25), the selection is performed so that the total value of the selected values becomes 1. This means that one of the VCO[0] to VCO[3] signals is selected totally four times so that the total phase is consistent with the phase of the VCO[1] signal. This selection corresponds to a third selection process.

The third selection process means that one supply mode is randomly selected four times from a plurality of supply modes including the first to fourth supply modes so that the total of phases of signals whose sampled voltages are inputted into the charge pump P2 is consistent with the phase of the VCO[1] signal (third signal).

In the other words, one supply mode is randomly selected four times from a plurality of supply modes including the first to fourth supply modes so that the total of phases of signals whose sampled voltages are inputted into the charge pump P1 is consistent with the phase of the VCO[3] signal (fourth signal).

When the inputted lower 2-bit value is 10(0.5), the selection is performed so that the total value of the selected values becomes 2. This means that one of the VCO[0] to VCO[3] signals is selected totally four times so that the total phase is consistent with the phase of the VCO[2] signal. This selection corresponds to a second selection process.

The second selection process means that one supply mode is randomly selected four times from a plurality of supply modes including the first to fourth supply modes so that the total of phases of signals whose sampled voltages are inputted into the charge pump P2 is consistent with the phase of the VCO[1] signal (second signal).

In the other words, one supply mode is randomly selected four times from a plurality of supply modes including the first to fourth supply modes so that the total of phases of signals whose sampled voltages are inputted into the charge pump P1 is consistent with the phase of the VCO[0] signal (first signal).

When the inputted lower 2-bit value is 11(0.75), the selection is performed so that the total value of the selected values becomes −1. This means that one of the VCO[0] to VCO[3] signals is selected totally four times so that the total phase is consistent with the phase of the VCO[3] signal. This selection corresponds to a fourth selection process.

The fourth selection process means that one supply mode is randomly selected four times from a plurality of supply modes including the first to fourth supply modes so that the total of phases of signals whose sampled voltages are inputted into the charge pump P2 is consistent with the phase of the VCO[3] signal (fourth signal).

In the other words, one supply mode is randomly selected four times from a plurality of supply modes including the first to fourth supply modes so that the total of phases of signals whose sampled voltages are inputted into the charge pump P1 is consistent with the phase of the VCO[1] signal (third signal).

FIG. 14 (B) shows lower 2-bit values and corresponding output examples of the ΔΣ modulator.

In this example, when the lower 2-bit value is 00(0), four values 0, −1, 2, and −1 are randomly selected. 0+(−1)+2+(−1)=0. Naturally, another value combination can be selected. For example, four values 1, −1, 1, and −1 may be selected. It is desirable to include two or more different kinds of values.

When the lower 2-bit value is 01(0.25), 2, −1, 0, and 0 are selected. 2+(−1)+0+0=1.

When the lower 2-bit value is 10(0.5), 1, 1, 0, and 0 are selected. 1+1+0+0=2.

When the lower 2-bit value is 11(0.75), 0, 1, −1, and −1 are selected. 1+(−1)+(−1)+0=−1.

The decoder 454 retains the correspondence between the four values (0, 1, 2, −1) shown in FIG. 14 (A) and a pair of VCO signals whose sampled voltages are supplied to the charge pumps P1 and P2.

Corresponding to the value "0," codes 1, 0, 0, and 0 (first, second, third, and fourth select signals) are retained.

Corresponding to the value "1," codes 0, 1, 0, and 0 are retained.

Corresponding to the value "2," codes 0, 0, 1, and 0 are retained.

Corresponding to the value "−1," codes 0, 0, 0, and 1 are retained.

The technical meaning of the first to fourth select signals is similar to the preceding embodiments.

The decoder 454 uses the divided-by-M signal (divided-by-M VCO output) as an operation clock. The decoder 454 outputs codes (first to fourth select signals) depending on the value inputted from the ΔΣ modulator 455.

When the decoder 454 is inputted with 0, −1, 2, and −1 shown on the uppermost side of FIG. 14 (B), for example, the decoder 454 outputs "1, 0, 0, 0," "0, 0, 0, 1," "0, 0, 1, 0," and "0, 0, 0, 1" corresponding to the above values respectively.

The shift register 456 shifts the codes inputted from the decoder 454 depending on the upper 2 bits of the counter value inputted from the counter 453. Shift processes (a)-(d) will be shown in detailed in the following.

(a) When the inputted upper 2 bits are 00(0), no shift process is performed and the codes inputted from the decoder 454 are outputted without being changed.

(b) When the inputted upper 2 bits are 01(1), the codes inputted from the decoder 454 are shifted as shown below.
 the first select signal=>the second select signal
 the second select signal=>the third select signal
 the third select signal=>the fourth select signal
 the fourth select signal=>the first select signal The value allocation for each VCO signal in FIG. 14(A) is achieved when the VCO[0] signal is the target. When the upper 2 bits are 01(1), the VCO[1] signal should be the target, which is realized by shifting the select signals.

As another technique, a structure without the shift register can be realized by letting the decoder 454 change the correspondence relation between the value and the codes. In the case of VCO[0]:−1, VCO[1]:0, VCO[2]:1, and VCO[3]:2, the correspondence relation must be achieved so that −1 corresponds to "1, 0, 0, 0," 0 corresponds to "0, 1, 0, 0," 1 corresponds to "0, 0, 1, 0," and 2 corresponds to "0, 0, 0, 1."

(c) When the inputted upper 2 bits are 10(2), the code inputted from the decoder 454 is shifted as shown below.
 the first select signal=>the third select signal
 the second select signal=>the fourth select signal
 the third select signal=>the first select signal
 the fourth select signal=>the second select signal When the upper 2 bits are 10(2), the VCO[2] signal should be the target, which is realized by shifting the select signals.

As another technique, a structure without the shift register can be realized by letting the decoder 454 change the correspondence relation between the value and the codes. In the case of VCO[0]:2, VCO[1]:−1, VCO[2]:0, and VCO[3]:1, the correspondence relation must be achieved so that 2 corresponds to "1, 0, 0, 0," −1 corresponds to "0, 1, 0, 0," 0 corresponds to "0, 0, 1, 0," and 1 corresponds to "0, 0, 0, 1."

(d) When the inputted upper 2 bits are 11(3), the codes inputted from the decoder 454 are shifted as shown below.
 the first select signal=>the fourth select signal
 the second select signal=>the first select signal
 the third select signal=>the second select signal
 the fourth select signal=>the third select signal When the upper 2 bits are 11(3), the VCO[3] signal should be the target, which is realized by shifting the select signals.

As another technique, a structure without the shift register can be realized by letting the decoder 454 change the correspondence relation between the value and the codes. In the case of VCO[0]:1, VCO[1]:2, VCO[2]:−1, and VCO[3]:0, the correspondence relation must be achieved so that 1 corresponds to "1, 0, 0, 0," 2 corresponds to "0, 1, 0, 0," −1 corresponds to "0, 0, 1, 0," and 0 corresponds to "0, 0, 0, 1."

In the example shown in FIG. 13, when the output codes (first to fourth select signals) from the decoder are "1, 0, 0, 0" and the upper 2 bits are 00(0), the shift register 456 does not perform shift operation based on the above shift rule and outputs "1, 0, 0, 0" which are the same values as the output codes from the decoder.

On the other hand, when the output codes (first to fourth select signals) from the decoder are "0, 0, 1, 0" and the upper 2 bits are 01(1), the shift register 456 outputs "0, 0, 0, 1," which are obtained by shifting each select signal based on the above shift rule.

Figure 12:
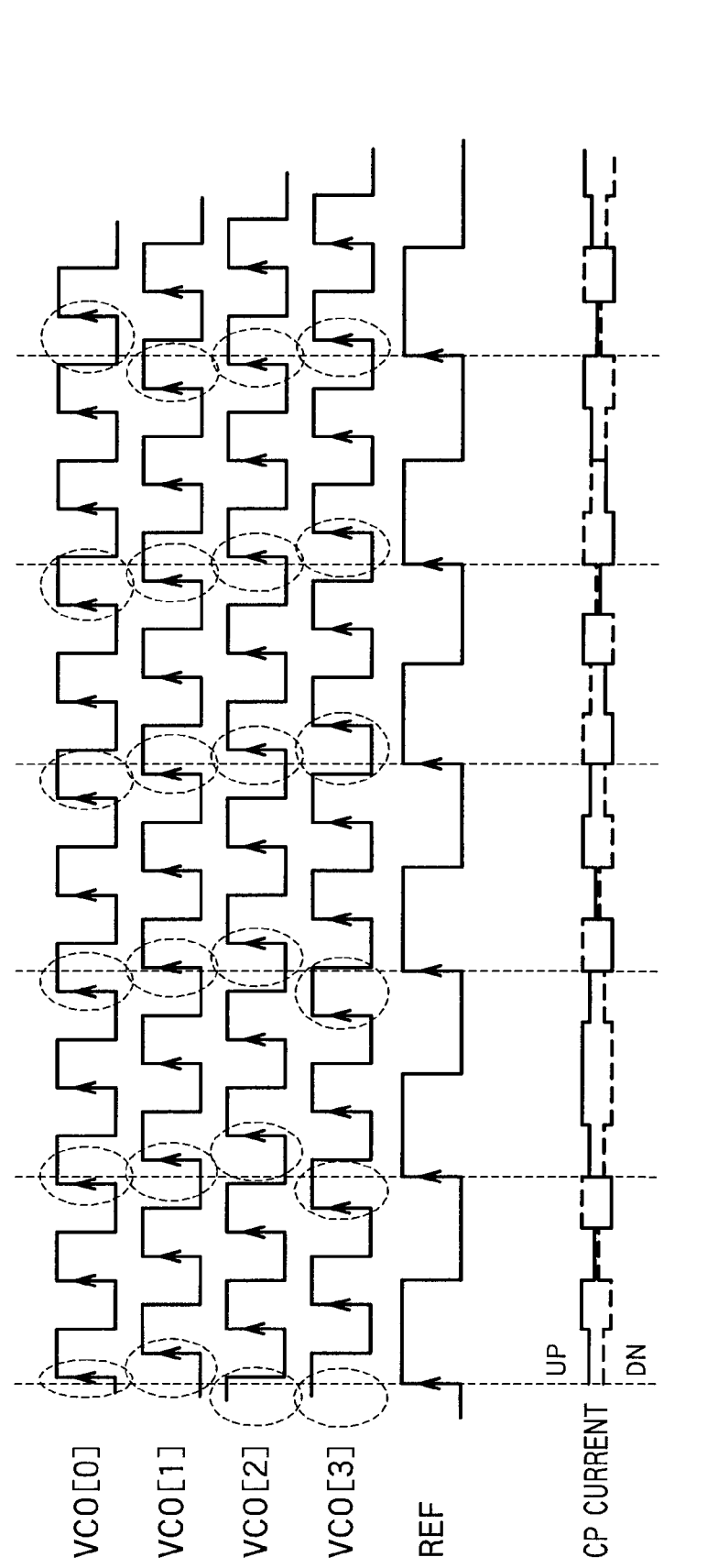
FIG. 12 shows a time chart of a PLL according to the sixth embodiment.

FIG. 12 shows time charts of the PLL according to the present embodiment.

Compared to the preceding embodiments, over-sampling is performed on the output of the counter 453 with four times greater frequency, and thus one code in the preceding embodiments corresponds to four codes in the present embodiment. Charge switching operation is performed four times in one cycle period of the reference signal. Compared to FIG. 9 explained in the fourth embodiment, periodically generated differences, which is namely spurious outputs, are randomized.

In the example of FIG. 12, the frequency of the divided-by-M signal is exactly four times greater than that of the reference signal for simplification, but the effect of the present embodiment can be achieved without any problems even when there is a minor difference between the frequencies of these signals.

The randomized difference is shifted to the high-frequency area on the frequency axis depending on the order of the $\Delta\Sigma$ modulator and further an LPF serving as a transfer function of the PLL operates, and thus the difference can be considerably restrained compared to the fourth embodiment.

Further, since the $\Delta\Sigma$ modulator performs random selection, even when there is a phase mismatch among the four phase signals (including the case where the four phase signals are not exactly in the relationship of 0, $\pi/2$, $\pi$, and $3\pi/2(-\pi/2)$), the difference is effectively randomized instead of being periodically generated.

Hereinafter, supplementary explanation of the select signal generator 450 will be made. In the above example, while the lower 2 bits of the counter value changes in the order of 00=>01=>10=>11, the upper 2 bits of this counter value is the same value.

(A) When the upper 2 bits are 00 (the first supply mode is selected), the lower 2 bits of the counter value changes in the order of 00=>01=>10=>11, and the first to fourth selection processes are correspondingly performed in the order of the first, third, second, and fourth selection processes. This operation is already explained above.

The first selection process corresponds to a process for synchronizing the phase of VCO[0] with the phase of the reference signal at their rising edges.

The third selection process corresponds to a process for synchronizing the phase of VCO[0] with the phase of the reference signal at their rising edges at the point ahead of the rising edge of VCO[0] by a quarter of the interval between the rising edges of VCO[1].

The second selection process corresponds to a process for synchronizing the phase of VCO[0] with the phase of the reference signal at their rising edges at the point ahead of the rising edge of VCO[0] by two fourths of the interval between the rising edges of VCO[1].

The fourth selection process corresponds to a process for synchronizing the phase of VCO[0] with the phase of the reference signal at their rising edges at the point ahead of the rising edge of VCO[0] by three fourths of the interval between the rising edges VCO[1].

(B) Similarly, when the upper 2 bits are 01 (the third supply mode is selected), the first to fourth selection processes are performed in the order of the first, third, second, and fourth selection processes, which is similar to performing the third, second, fourth, and first selection processes in this order since the select signals are actually shifted by the shift register.

The third selection process corresponds to a process for synchronizing the phase of VCO[1] with the phase of the reference signal at their rising edges.

The second selection process corresponds to a process for synchronizing the phase of VCO[1] with the phase of the reference signal at their rising edges at the point ahead of the rising edge of VCO[1] by a quarter of the interval between the rising edges of VCO[2].

The fourth selection process corresponds to a process for synchronizing the phase of VCO[1] with the phase of the reference signal at their rising edges at the point ahead of the rising edge of VCO[1] by two fourths of the interval between the rising edges of VCO[2].

The first selection process corresponds to a process for synchronizing the phase of VCO[1] with the phase of the reference signal at their rising edges at the point ahead of the rising edge of VCO[1] by three fourths of the interval between the rising edges of VCO[2].

(C) When the upper 2 bits are 10 (the second supply mode is selected), the first to fourth selection processes are performed in the order of the first, third, second, and fourth selection processes, which is similar to performing the second, fourth, first, and third selection processes in this order since the select signals are actually shifted by the shift register.

The second selection process corresponds to a process for synchronizing the phase of VCO[2] with the phase of the reference signal at their rising edges.

The fourth selection process corresponds to a process for synchronizing the phase of VCO[2] with the phase of the reference signal at their rising edges at the point ahead of the rising edge of VCO[2] by a quarter of the interval between the rising edges of VCO[3].

The first selection process corresponds to a process for synchronizing the phase of VCO[2] with the phase of the reference signal at their rising edges at the point ahead of the rising edge of VCO[2] by two fourths of the interval between the rising edges of VCO[3].

The third selection process corresponds to a process for synchronizing the phase of VCO[2] with the phase of the reference signal at their rising edges at the point ahead of the rising edge of VCO[2] by three fourths of the interval between the rising edges of VCO[3].

(D) When the upper 2 bits are 11 (the fourth supply mode is selected), the first to fourth selection processes are performed in the order of the first, third, second, and fourth selection processes, which is similar to performing the fourth, first, third, and second selection processes in this order since the select signals are actually shifted by the shift register.

The fourth selection process corresponds to a process for synchronizing the phase of VCO[3] with the phase of the reference signal at their rising edges.

The first selection process corresponds to a process for synchronizing the phase of VCO[3] with the phase of the reference signal at their rising edges at the point ahead of the rising edge of VCO[3] by a quarter of the interval between the rising edges of VCO[0].

The third selection process corresponds to a process for synchronizing the phase of VCO[3] with the phase of the reference signal at their rising edges at the point ahead of the rising edge of VCO[3] by two fourths of the interval between the rising edges of VCO[0].

The second selection process corresponds to a process for synchronizing the phase of VCO[3] with the phase of the reference signal at their rising edges at the point ahead of the rising edge of VCO[3] by three fourths of the interval between the rising edges of VCO[0].

In the present embodiment, over-sampling is performed with a frequency four times greater than that of the reference signal (1/4 cycle), but the over-sampling may be performed with a frequency approximately L times greater than that of the reference signal (1/L cycle) by using an integer L of 2 or greater. In this case, the $\Delta\Sigma$ modulator uses a divided-by-L having a frequency approximately L times greater than that of the reference signal as an operation clock.

Further, in the example shown in the present embodiment, K=0.25 (fractional dividing ratio of 0.25/4=0.0625), but K may be an integer. For example, K=1 (fractional dividing ratio of 1/4=0.25).

In this case, the lower 2 bits of the counter value is constantly 00, which corresponds to the case where the upper 2 bits changes in the order of 00, 01, 10, and 11. Thus, the $\Delta\Sigma$ modulator constantly performs the first selection process.

Considering the shift process of the shift register 456, it can be regarded that the first selection process, the third selection process, the second selection process, and the fourth selection process are performed corresponding to the upper 2 bits 00, 01, 10, and 11, respectively.

The first selection process corresponds to a process for synchronizing the phase of VCO[0] with the phase of the reference signal at their rising edges.

The third selection process corresponds to a process for synchronizing the phase of VCO[1] with the phase of the reference signal at their rising edges.

The second selection process corresponds to a process for synchronizing the phase of VCO[2] with the phase of the reference signal at their rising edges.

The fourth selection process corresponds to a process for synchronizing the phase of VCO[3] with the phase of the reference signal at their rising edges.

The present embodiment can be applied not only to a PLL using two charge pumps but also to a PLL using many charge pumps as shown in FIG. 1.

As stated above, according to the present embodiment, spurious outputs of the PLL due to the mismatch among a plurality of charge pumps can be completely or almost completely prevented while capable of setting a further smaller fractional dividing ratio with small difference. In addition, even when a phase mismatch is caused multiphase VCO signals, the difference is not periodically caused and thus, spurious outputs of the PLL can be considerably restrained.

Seventh Embodiment

Figure 15:
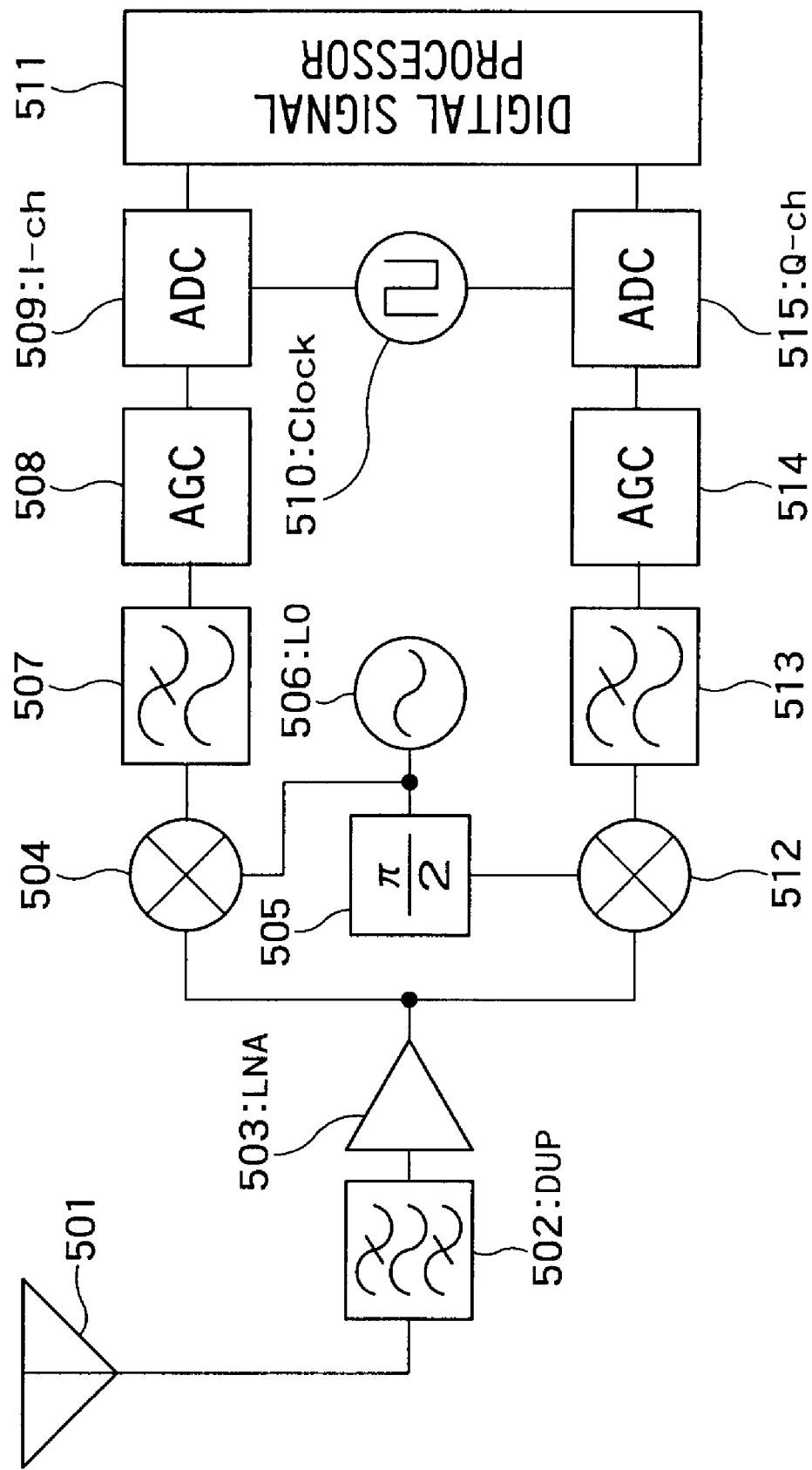
FIG. 15 shows the structure of a receiver according to a seventh embodiment.

FIG. 15 shows the structure of a receiver according to a seventh embodiment.

This receiver includes: an antenna 501; a duplexer (DUP) 502; a low noise amplifier (LNA) 503; a local oscillator 506; a $\pi/2(90°)$ phase shifter 505; a digital signal processor 511; a mixer 504; a low pass filter (LPF) 507; an automatic gain control (AGC) 508; an analog-digital converter (ADC) 509; a mixer 512; an LPF 513; an AGC 514; an ADC 515; and a clock generating circuit 510. Each of the mixers 504 and 512 is a quadrature demodulator.

The antenna 501 receives a radio frequency (RF) signal and inputs the RF signal into the duplexer 502.

The duplexer 502 removes unnecessary waves from the RF signal and transmits it to the LNA 503.

The LNA 503 amplifies the RF signal from the duplexer 502, and inputs it into the mixer 504 and the mixer 512.

The local oscillator 506 generates a local signal for downconverting the RF signal, and inputs the local signal into the mixer 504 and the 90° phase shifter 505.

The 90° phase shifter 505 shifts the phase of the local signal from the local oscillator 506 by 90°, and inputs it into the mixer 512.

The mixer 504 multiplies the RF signal from the LNA 503 and the local signal from the local oscillator 506 to generate an I signal (a base-band signal).

The mixer 512 multiplies the RF signal and the local signal whose phase is shifted by the 90° phase shifter 505 to generate a Q signal (a base-band signal).

The mixers 504 and 512, the 90° phase shifter 505, and the local oscillator 506 form a RF unit.

The LPFs 507 and 513 remove high frequency components from the I signal generated by the mixer 504 and from the Q signal generated by the mixer 512, respectively.

The AGCs 508 and 514 adjust the levels of signals passed through the LPFs 507 and 513 respectively.

The clock generating circuit 510 is formed of a phase-locked loop circuit according to any one of the above first to fourth embodiments.

The clock generating circuit 510 generates sampling clocks used by the ADCs 509 and 515.

The sampling clock is one of the VCO[0] to VCO[3] signals generated by the voltage-controlled oscillator of the phase-locked loop circuit according to any one of the first to sixth embodiments. For example, the sampling clock is the VCO[0] signal.

The ADCs 509 and 515 sample the I signal and the Q signal depending on the sampling clocks generated by the clock generating circuit 510 to convert the signals into digital data, and input the digital data into the digital signal processor 511.

The digital signal processor 511 is formed of a digital signal processor (DSP), for example. The digital signal processor 511 processes the digital I and Q signals from the ADCs 509 and 515 to decode and reproduce the data.

As stated above, according to the present embodiment, the clock generating circuit for generating the sampling clocks of the ADCs converting the I signal and the Q signal is formed by using the phase-locked loop circuit of any one of the first to fourth embodiments. Therefore, the clock generating circuit is smaller in size and consumes lower power compared to the conventional circuit, and can generation a high-accuracy and low-jitter sampling clock.

The invention claimed is:

1. A phase-locked loop circuit comprising:
    a reference signal source configured to generate a reference signal having cycles;
    a voltage-controlled oscillator configured to generate a first signal and a second signal having a phase reverse to that of the first signal, frequencies of the first signal and the second signal being controlled depending on control voltages;
    a sub-sampling phase comparator configured to generate a first sampled voltage and a second sampled voltage by sampling voltages of the first signal and the second signal in each cycle of the reference signal;
    a current generating circuit having a first charge pump configured to generate a first current signal depending on a supply voltage and a second charge pump configured to generate a second current signal having a polarity reverse to that of the first current signal depending on a supply voltage, and configured to generate a composite current signal of the first current signal and the second current signal;
    a selection controller configured to selectively carry out a first supply mode for supplying the first and second sampled voltages to the second and first charge pumps respectively and a second supply mode for supplying the first and second sampled voltages to the first and second charge pumps respectively; and
    a loop filter configured to generate the control voltages supplied to the voltage-controlled oscillator by smoothing the composite current signal.

2. The circuit of claim 1,
    wherein the voltage-controlled oscillator further generates a third signal having a phase delayed from that of the first signal by π/2 and a fourth signal having a phase delayed from that of the second signal by π/2, the sub-sampling phase comparator generates first to fourth sampled voltages by sampling the voltages of the first to fourth signals in each cycle of the reference signal, and the selection controller selectively carries out the first supply mode, the second supply mode, a third supply mode for supplying the third and fourth sampled voltages to the second and first charge pumps respectively, and a fourth supply mode for supplying the third and fourth sampled voltages to the first and second charge pumps respectively.

3. The circuit of claim 2, wherein the selection controller repeatedly carries out the first to fourth supply modes in the order of the first supply mode, the third supply mode, the second supply mode, and the fourth supply mode.

4. The circuit of claim 2, wherein the selection controller repeatedly carries out the first to fourth supply modes in the order of the fourth supply mode, the second supply mode, the third supply mode, and the first supply mode.

5. The circuit of claim 2, wherein the current generating circuit further comprises:

a third charge pump configured to generate a third current signal having a polarity identical to that of the first current signal depending on a supply voltage;

a fourth charge pump configured to generate a fourth current signal having a polarity reverse to that of the third current signal depending on a supply voltage;

a fifth charge pump configured to generate a fifth current signal having a polarity identical to that of the first current signal depending on a supply voltage;

a sixth charge pump configured to generate a sixth current signal having a polarity reverse to that of the fifth current signal depending on a supply voltage;

a seventh charge pump configured to generate a seventh current signal having a polarity identical to that of the first current signal depending on a supply voltage; and an eighth charge pump configured to generate an eighth current signal having a polarity reverse to that of the seventh current signal depending on a supply voltage, the first and second sampled voltages are supplied to the second and third charge pumps respectively in the first supply mode, the first and second sampled voltages are supplied to the first and fourth charge pumps respectively in the second supply mode, the third and fourth sampled voltages are supplied to the sixth and seventh charge pumps respectively in the third supply mode, the third and fourth sampled voltages are supplied to the fifth and eighth charge pumps respectively in the fourth supply mode, and the current generating circuit generates a composite current signal of the second and third current signals, a composite current signal of the sixth and seventh current signals, a composite current signal of the first and fourth current signals, and a composite current signal of the fifth and eighth current signals.

6. The circuit of claim 5, wherein a plurality of each of the first to eighth charge pumps are arranged, respectively and the selection controller includes a DEM (Dynamic Element Matching) unit configured to switch a charge pump to be used so that every charge pump in the first to eighth charge pumps is evenly used for each of the first to eight charge pumps.

7. The circuit of claim 2, wherein when the first supply mode is selected, a first selection process is performed to select randomly a supply mode L times (L is an integer of 2 or greater) from a plurality of supply modes including the first to fourth supply modes so that the total of phases of signals whose sampled voltages are inputted into the second charge pump becomes identical to the phase of the first signal, and L supply modes selected in the first selection process are sequentially carried out in a 1/L cycle of the reference signal, when the second supply mode is selected, a second selection process is performed to select randomly a supply mode L times from a plurality of supply modes including the first to fourth supply modes so that the total of phases of signals whose sampled voltages are inputted into the second charge pump becomes identical to the phase of the second signal, and L supply modes selected in the second selection process are sequentially carried out in a 1/L cycle of the reference signal, when the third supply mode is selected, a third selection process is performed to select randomly a supply mode L times from a plurality of supply modes including the first to fourth supply modes so that the total of phases of signals whose sampled voltages are inputted into the second charge pump becomes identical to the phase of the third signal, and L supply modes selected in the third selection process are sequentially carried out in a 1/L cycle of the reference signal, and when the fourth supply mode is selected, a fourth selection process is performed to select randomly a supply mode L times from a plurality of supply modes including the first to fourth supply modes so that the total of phases of signals whose sampled voltages are inputted into the second charge pump becomes identical to the phase of the fourth signal, and L supply modes selected in the fourth selection process are sequentially carried out in a 1/L cycle of the reference signal.

8. The circuit of claim 2, wherein when the first supply mode is selected, a first selection process is performed to select randomly a supply mode L times (L is an integer of 2 or greater) from a plurality of supply modes including the first to fourth supply modes so that the total of phases of signals whose sampled voltages are inputted into the first charge pump becomes identical to the phase of the second signal, and L supply modes selected in the first selection process are sequentially carried out in a 1/L cycle of the reference signal, when the second supply mode is selected, a second selection process is performed to select randomly a supply mode L times from a plurality of supply modes including the first to fourth supply modes so that the total of phases of signals whose sampled voltages are inputted into the first charge pump becomes identical to the phase of the first signal, and L supply modes selected in the second selection process are sequentially carried out in a 1/L cycle of the reference signal, when the third supply mode is selected, a third selection process is performed to select randomly a supply mode L times from a plurality of supply modes including the first to fourth supply modes so that the total of phases of signals whose sampled voltages are inputted into the first charge pump becomes identical to the phase of the fourth signal, and L supply modes selected in the third selection process are sequentially carried out in a 1/L cycle of the reference signal, and when the fourth supply mode is selected, a fourth selection process is performed to select randomly a supply mode L times from a plurality of supply modes including the first to fourth supply modes so that the total of phases of signals whose sampled voltages are inputted into the first charge pump becomes identical to the phase of the fourth signal, and L supply modes selected in the fourth selection process are sequentially carried out in a 1/L cycle of the reference signal.

9. The circuit of claim 7, wherein the selection controller selects each of the first to fourth supply modes a plurality of times in sequence, respectively, the first, third, second, and fourth selection processes are carried out in this order every time the first supply mode is selected, the third, second, fourth, and first selection processes are carried out in this order every time the second supply mode is selected, the second, fourth, first, the and third selection processes are carried out in this order every time the third supply mode is selected, and the fourth, first, third, and second selection processes are carried out in this order every time the fourth supply mode is selected.

10. The circuit of claim 2, wherein the selection controller alternately carries out only the first supply mode and the second supply mode among the first to fourth supply modes, or alternately carries out only the third supply mode and the fourth supply mode.

11. The circuit of claim 1, wherein the selection controller alternately carries out the first supply mode and the second supply mode.

12. The circuit of claim 1, wherein the current generating circuit further comprises:

a third charge pump configured to generate a third current signal having a polarity identical to that of the first current signal depending on a supply voltage; and a fourth charge pump configured to generate a fourth current signal having a polarity reverse to that of the third current signal depending on a supply voltage, the first and second sampled voltages are supplied to the second and third charge pumps respectively in the first supply mode, the first and second sampled voltages are supplied to the first and fourth charge pumps respectively in the second supply mode, and the current generating circuit generates a composite current signal of the second and third current signals and a composite current signal of the first and fourth current signals.

13. The circuit of claim 12, wherein a plurality of each of the first to fourth charge pumps is arranged, and the selection controller includes a DEM unit configured to switch a charge pump to be used so that every charge pump in the first to fourth charge pumps is evenly used for each of the first to eight charge pumps.

14. A radio receiver comprising:

an antenna configured to receive a high frequency signal to generate an analog reception signal;

an RF unit configured to down-convert the analog reception signal to generate a base-band signal;

a clock generating circuit configured to generate clocks;

an analog-digital converter configured to convert the base-band signal into a digital signal based on the clocks generated by the clock generating circuit; and a data signal processor configured to perform a digital signal processing on the digital signal to reproduce data;

wherein the clock generating circuit is the phase-locked loop circuit of claim 1.

* * * * *